(12) United States Patent
Oi

(10) Patent No.: US 8,669,653 B2
(45) Date of Patent: Mar. 11, 2014

(54) SEMICONDUCTOR DEVICE HAVING ELECTRONIC COMPONENT IN THROUGH PART, ELECTRONIC DEVICE, AND MANUFACTURING METHOD OF SEMICONDUCTOR

(75) Inventor: Kiyoshi Oi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 191 days.

(21) Appl. No.: 12/730,455

(22) Filed: Mar. 24, 2010

(65) Prior Publication Data

US 2010/0244230 A1    Sep. 30, 2010

(30) Foreign Application Priority Data

Mar. 26, 2009  (JP) ................................. 2009-077033

(51) Int. Cl.
*H01L 23/522* (2006.01)
*H01L 23/488* (2006.01)
*H01L 21/50* (2006.01)

(52) U.S. Cl.
USPC ........... 257/692; 257/777; 257/643; 257/686; 257/E21.499; 257/E23.023; 438/121; 438/118; 438/109

(58) Field of Classification Search
USPC .................. 257/692, 777, 643, 686, E21.499, 257/E23.023, E23.142; 438/121, 118, 109
See application file for complete search history.

(56) References Cited

U.S. PATENT DOCUMENTS

| | | | | |
|---|---|---|---|---|
| 5,306,670 | A * | 4/1994 | Mowatt et al. .................. | 29/832 |
| 6,303,989 | B1 * | 10/2001 | Yasuho et al. ................ | 257/706 |
| 6,909,054 | B2 * | 6/2005 | Sakamoto et al. ............ | 174/260 |
| 7,078,788 | B2 * | 7/2006 | Vu et al. ........................ | 257/668 |
| 7,176,556 | B2 * | 2/2007 | Okamoto et al. ............. | 257/621 |
| 7,279,776 | B2 * | 10/2007 | Morimoto ...................... | 257/621 |
| 8,018,033 | B2 * | 9/2011 | Moriya ......................... | 257/659 |
| 8,130,507 | B2 * | 3/2012 | Origuchi et al. .............. | 361/760 |
| 2007/0029106 | A1 * | 2/2007 | Kato .............................. | 174/255 |
| 2008/0087993 | A1 * | 4/2008 | Aokura et al. ................ | 257/673 |

FOREIGN PATENT DOCUMENTS

| | | |
|---|---|---|
| JP | 06-013541 | 1/1994 |
| WO | 02/15266 | 2/2002 |
| WO | 02/33751 | 4/2002 |

* cited by examiner

*Primary Examiner* — Lex Malsawma
*Assistant Examiner* — Sheng Zhu
(74) *Attorney, Agent, or Firm* — Drinker Biddle & Reath LLP

(57) ABSTRACT

A semiconductor device includes: a wiring board which includes a first face and a second face and in which a conductor pattern and a through part are provided; an electronic component which includes an electrode pad forming face where an electrode pad is formed and which is housed in the through part so that the electrode pad forming face is provided on the first face side; a seal resin which is provided in the through part and the electrode pad forming face, seals the electronic component and includes a first plane exposing a connection face of the electrode pad; and a wiring pattern which is provided in the first face of the wiring board and the first plane of the seal resin and electrically connects the connection face of the electrode pad with a first connected face of the conductor pattern, and which includes a pad part.

12 Claims, 22 Drawing Sheets

SEMICONDUCTOR DEVICE HAVING ELECTRONIC COMPONENT IN THROUGH PART, ELECTRONIC DEVICE, AND MANUFACTURING METHOD OF SEMICONDUCTOR

This application claims priority from Japanese Patent Application No. 2009-077033, filed on Mar. 26, 2009, the entire contents of which are hereby incorporated by reference.

FIELD OF THE INVENTION

The present invention relates to a semiconductor device, an electronic device, and a manufacturing method of the semiconductor device, in particular, relates to a semiconductor device including a wiring board and an electronic component electrically connected to the wiring board, an electronic device, and a manufacturing method of the semiconductor device.

DESCRIPTION OF RELATED ART

FIG. 1 is a sectional view showing a related-art electronic device.

Referring to FIG. 1, a related-art electronic device 200 has semiconductor devices 201 and 202 and internal connection terminals 203. The semiconductor device 201 has a wiring board 211, an electronic component 212, underfill resin 213, and external connection terminals 214.

The wiring board 211 has stacked insulating layers 216 and 217, wiring patterns 219, 228, and 229, a pad 221, solder resist layers 222 and 226, and external connection pads 223 and 224. The insulating layer 216 is provided on an upper face 217A of the insulating layer 217.

The wiring pattern 219 and the pad 221 are provided on an upper face 216A of the insulating layer 216. The wiring pattern 219 has pad parts 232 and 233 exposed from the solder resist layer 222. The pad 221 is exposed from the solder resist layer 222.

The solder resist layer 222 is provided on the upper face 216A of the insulating layer 216. The external connection pads 223 and 224 are provided on a lower face 217B of the insulating layer 217. The lower faces of the external connection pads 223 and 224 are exposed from the solder resist layer 226.

The solder resist layer 226 is provided on the lower face 217B of the insulating layer 217. The wiring patterns 228 and 229 are internally provided in the stacked insulating layers 216 and 217. The wiring pattern 228 is connected to the pad part 233 and the external connection pad 223. The wiring pattern 229 is connected to the pad 221 and the external connection pad 224.

The electronic component 212 is placed between the semiconductor device 201 and the semiconductor device 202. The electronic component 212 has an electrode pad 236. The electrode pad 236 is electrically connected to the pad part 232 through a bump 237 (for example, a solder bump).

The underfill resin 213 is provided so as to fill a gap between the electronic component 212 and the wiring board 211. The external connection terminals 214 are provided on the lower faces of the external connection pads 223 and 224.

The semiconductor device 202 is placed above the semiconductor device 201. The semiconductor device 202 has a wiring board 241, an electronic component 243, and mold resin 246. The wiring board 241 is shaped like a board and has pads 251, 252, and 254. The pad 251 is opposed to the pad part 233 and is electrically connected to the pad part 233 through the internal connection terminal 203. The pad 252 is opposed to the pad 221 and is electrically connected to the pad 221 through the internal connection terminal 203. The pad 254 is electrically connected to the pad 251 or the pad 252.

The electronic component 243 is adhered onto the wiring board 241 and is electrically connected to the pad 254 through a metal wire 244. The mold resin 246 is provided on the wiring board 241. The mold resin 246 seals the metal wire 244 and the electronic component 243.

The internal connection terminal 203 has a diameter (height) such that the electronic component 212 and the semiconductor device 202 do not come in contact with each other. For example, the diameter of the internal connection terminal 203 can be set to 200 μm (for example, refer to Japanese Patent Laid-Open No. JP-A-1994-13541).

However, in the related-art semiconductor device 201, the electronic component 212 placed on the upper face side of the wiring board 211 and the wiring board 211 are electrically connected through the bump 237 and thus the semiconductor device 201 is upsized in its height direction.

In the related-art electronic device 200, the diameter (height) of the internal connection terminal 203 for electrically connecting the semiconductor device 201 and the semiconductor device 202 needs to be made larger than a value resulting from adding a height of the electronic component 212 and a height of the bump 237 and thus the electronic device 200 is upsized in its thickness direction.

The upsizing of the semiconductor device 201 and the electronic device 200 in the thickness direction also occurs when the electronic component 212 and the wiring board 211 are wire-bonded.

SUMMARY OF INVENTION

Illustrative aspects of the present invention provide a semiconductor device that can be downsized in a thickness direction of the semiconductor device, an electronic device, and a manufacturing method of the semiconductor device.

According to a first aspect of the invention, a semiconductor device is provided with: a wiring board which includes a first face and a second face provided on an opposite side to the first face and in which a conductor pattern and a through part penetrating the wiring board are provided; an electronic component which includes an electrode pad forming face where an electrode pad is formed, and a rear face placed on an opposite side to the electrode pad forming face, and which is housed in the through part so that the electrode pad forming face is provided on the first face side; a seal resin which is provided in the through part and the electrode pad forming face to seal the electronic component, and which includes a first plane exposing a connection face of the electrode pad; and a wiring pattern which is provided in the first face of the wiring board and the first plane of the seal resin to electrically connect the connection face of the electrode pad with a first connected face of the conductor pattern, and which includes a pad part.

Other aspects and advantages of the invention will be apparent from the following description, the drawings and the claims.

DETAILED DESCRIPTION OF EXEMPLARY EMBODIMENTS

Exemplary embodiments of the invention will be discussed below based on FIGS. 2 to 22.

First Exemplary Embodiment

Figure 1:
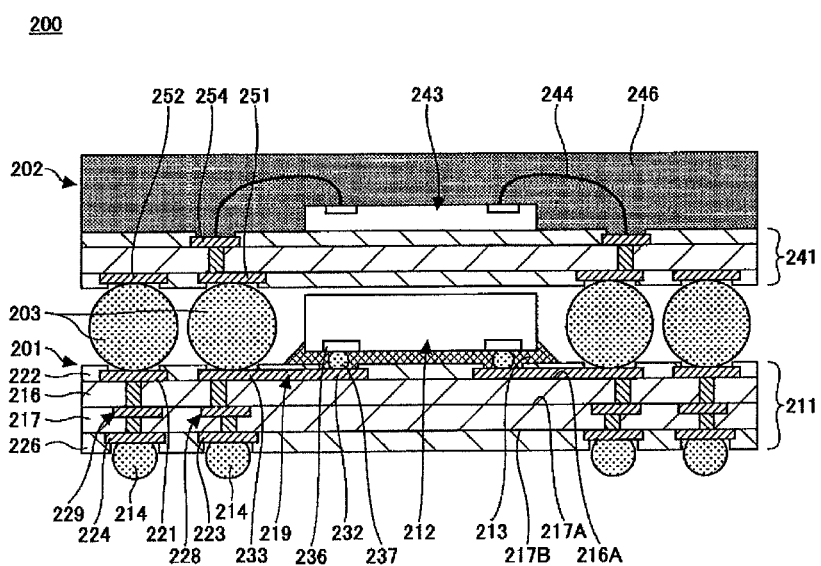
FIG. 1 is a sectional view showing a related-art electronic device.
Figure 2:
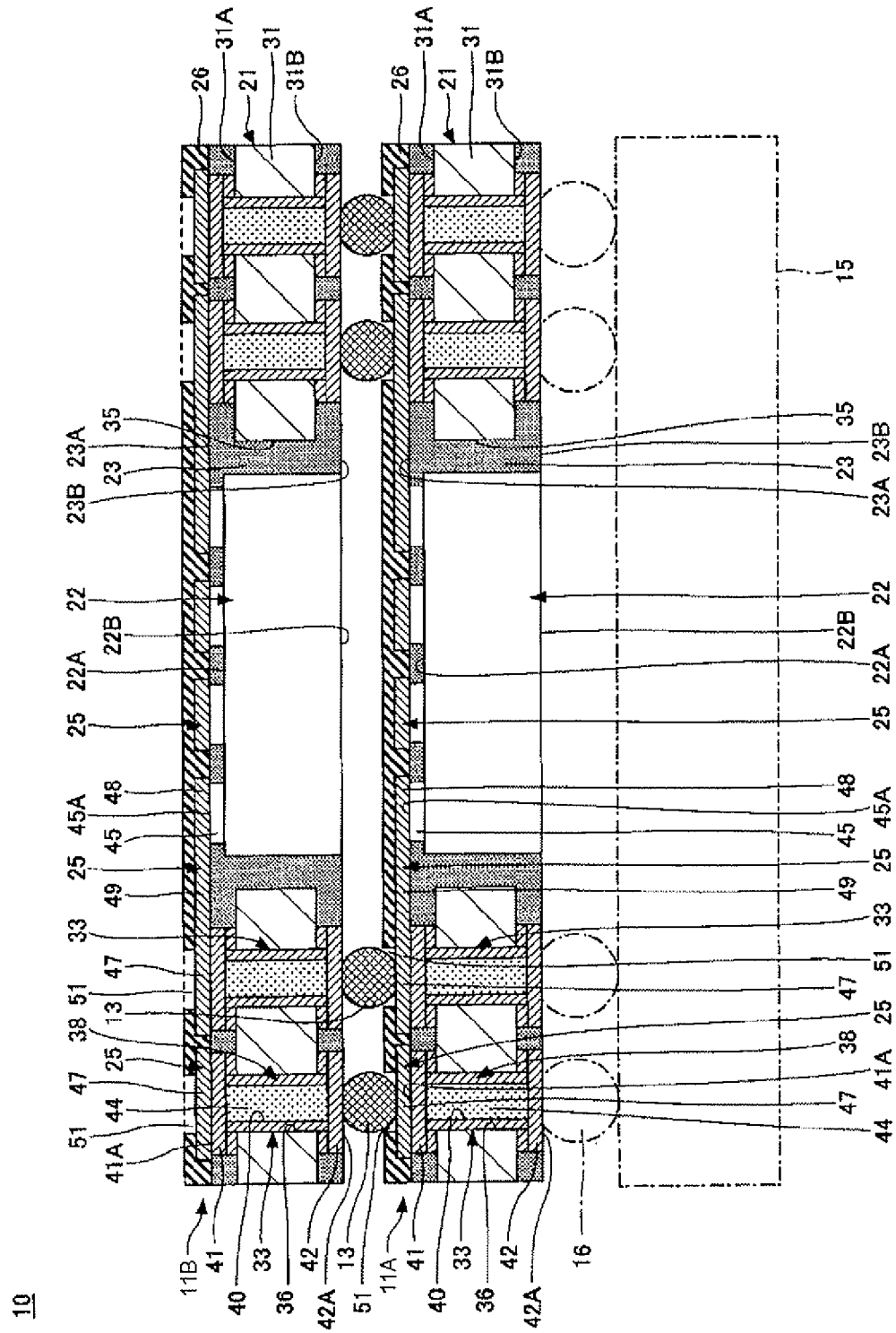
FIG. 2 is a sectional view showing an electronic device according to a first exemplary embodiment of the present invention.

FIG. 2 is a sectional view showing an electronic device according to a first exemplary embodiment of the present invention.

Referring to FIG. 2, an electronic device 10 of the first exemplary embodiment has a semiconductor device 11A, a semiconductor device 11B having a similar configuration to that of the semiconductor device 11A, and internal connection terminals 13. Therefore, in the description to follow, the configuration of the semiconductor device 11A will be mainly discussed.

The semiconductor device 11A has a wiring board 21, an electronic component 22, seal resin 23, a wiring pattern 25, and a solder resist layer 26.

The wiring board 21 has a multilayer wiring structure 31 and a through electrode 33 of a conductor pattern. The multilayer wiring structure 31 is made up of multiple stacked insulating layers (not shown) and multiple wiring and vias, etc., (not shown) formed on the multiple insulating layers. The multilayer wiring structure 31 is shaped like a board and has a through part 35 and through holes 36.

The through part 35 is formed so as to penetrate the center of the multilayer wiring structure 31. The through part 35 is a space to house the electronic component 22. If a size of the electronic component 22 on the plan view is 10 mm×10 mm, a size of the through part 35 on the plan view can be set to 11 mm×11 mm, for example.

Multiple through holes 36 are formed so as to penetrate the multilayer wiring structure 31 in a portion positioned surrounding the through part 35. For example, a diameter of the through hole 36 can be set to 250 μm.

The through electrode 33 projects from faces 31A (first face) and 31B (second face) of the multilayer wiring structure 31. The through electrode 33 has a via part 38 and pad parts 41 and 42. The via part 38 is provided in a side wall of the through hole 36 and the faces 31A and 31B of the multilayer wiring structure 31. A though hole 40 is formed in a center of the via part 38. The though hole 40 is filled with resin 44. The via part 38 is electrically connected to the multiple wiring and vias (not shown) provided on the multilayer wiring structure 31.

The pad part 41 is provided so as to cover an upper end of the via part 38 and an upper end of the resin 44. The pad part 41 is electrically connected to the via part 38. The pad part 41 has a first connection face 41A connected to the wiring pattern 25. The first connection face 41A is exposed from the face 31A of the multilayer wiring structure 31.

The pad part 42 is provided so as to cover a lower end of the via part 38 and a lower end of the resin 44. The pad part 42 is electrically connected to the via part 38. The pad part 42 has a second connection face 42A connected to an external connection terminal 16 (for example, a solder ball) electrically connected to a mounting board 15. That is, the pad part 42 is a portion functioning as an external connection pad of the electronic device 10. The second connection face 42A is exposed from the face 31B of the multilayer wiring structure 31.

For example, Cu can be used as a material of the through electrode 33.

The electronic component 22 has an electrode pad 45 having a connection face 45A, an electrode pad forming face 22A where the electrode pad 45 is formed, and a rear face 22B placed on a opposite side to the electrode pad forming face 22A. A thickness of the electronic component 22 is made substantially equal to a value of a height of the through electrode 33. The thickness of the electronic component 22 can be set to 300 μm, for example. For example, a CPU semiconductor chip can be used as the electronic component 22.

The electronic component 22 is housed in the through part 35 so that the connection face 45A is made planar with the first connection face 41A. Accordingly, the rear face 22B of the electronic component 22 is made planar with the second connection face 42A.

Thus, the electronic component 22 is housed in the through part 35 so that the connection face 45A is made planar with the first connection face 41A, whereby projecting of the electronic component 22 from the first connection face 41A of the through electrode 33 is eliminated. Therefore, the semiconductor device 11A can be downsized in its thickness direction.

The connection face 45A is made planar with the first connection face 41A and the rear face 22B of the electronic component 22 is made planar with the second connection face 42A, whereby projecting of the electronic component 22 housed in the through part 35 from the first and second connection faces 41A and 42A of the through electrode 33 is eliminated. Therefore, the semiconductor device 11A can be further downsized in the thickness direction.

The seal resin 23 is provided in the through part 35 in which the electronic component 22 is housed, the electrode pad forming face 22A, and the faces 31A and 31B of the multilayer wiring structure 31. Accordingly, the seal resin 23 seals the electronic component 22 and the side face of the through electrode 33 in the portion projected from both faces 31A and 31B of the multilayer wiring structure 31. The seal resin 23 has a face 23A (first plane) exposing the connection face 45A and the first connection face 41A and a face 23B (second plane) exposing the rear face 22B of the electronic component 22 and the second connection face 42A. The face 23A of the seal resin 23 is made planar with the connection face 45A and the first connection face 41A.

Thus, the face 23A of the seal resin 23, the connection face 45A, and the first connection face 41A are placed on the same plane, whereby the wiring pattern 25 connected to the connection face 45A and the first connection face 41A can be formed with good accuracy on the face 23A of the seal resin 23, the connection face 45A, and the first connection face 41A.

The face 23B of the seal resin 23 is made planar with the second connection face 42A and the rear face 22B of the electronic component 22.

Thus, the face 23B of the seal resin 23 is made planar with the second connection face 42A and the rear face 22B of the electronic component 22 (in other words, the seal resin 23 is provided so as not to project from the rear face 22B of the electronic component 22 or the second connection face 42A), whereby upsizing the semiconductor device 11A in the thickness direction can be prevented.

For example, a mold compound of epoxy, etc., an epoxy sheet, etc., can be used as a base material of the described seal resin 23.

The wiring pattern 25 is provided on the face 23A of the seal resin 23, the first connection face 41A, and the connection face 45A placed on the same plane. The wiring pattern 25 has pad parts 47 and 48 and a wiring part 49.

The pad part 47 is provided on the first connection face 41A and is electrically connected to the through electrode 33. The pad part 48 is provided on the connection face 45A and is electrically connected to the electrode pad 45. The wiring part 49 is provided on the face 23A of the seal resin 23. The wiring part 49 has one end formed integrally with the pad part 47 and the other end formed integrally with the pad part 48. Accordingly, the through electrode 33 and the electronic component 22 are electrically connected through the wiring pattern 25.

Thus, the wiring pattern 25 and the electrode pad 45 are electrically connected without the intervention of bump, whereby the electric connection reliability between the through electrode 33 and the electronic component 22 can be improved.

For example, Cu can be used as a material of the described wiring pattern 25.

The solder resist layer 26 is provided on the face 23A of the seal resin 23 and the wiring part 49. The solder resist layer 26 has an opening 51 exposing the pad part 47.

According to the semiconductor device of the exemplary embodiment, the electronic component 22 is housed in the through part 35 formed in the multilayer wiring structure 31, the connection face 45A of the electrode pad 45 is made planar with the first connection face 41A, and the rear face 22B of the electronic component 22 is made planar with the second connection face 42A, whereby projecting of the electronic component 22 from the first and second connection faces 41A and 42A of the through electrode 33 is eliminated. Therefore, the semiconductor device 11A can be downsized in the thickness direction.

The wiring pattern 25 and the electrode pad 45 are directly connected without the intervention of bump, whereby the electric connection reliability between the through electrode 33 and the electronic component 22 can be improved.

The semiconductor device 11B has a similar configuration to that of the semiconductor device 11A. Therefore, the semiconductor device 11B can provide similar advantages to those of the semiconductor device 11A described above. The semiconductor device 11B is placed above the semiconductor device 11A so that the pad part 47 provided in the semiconductor device 11A and a pad part 42 provided in the semiconductor device 11B face to each other. The face of the semiconductor device 11B on the side opposed to the semiconductor device 11A is made a flat face.

The internal connection terminals 13 are provided between the semiconductor device 11A and the semiconductor device 11B. The semiconductor device 11A in the portion opposed to the semiconductor device 11B has a small step (for example, 50 μm) because the wiring pattern 25 and the solder resist layer 26 are formed on the face 23A of the seal resin 23, the first connection face 41A, and the connection face 45A placed on the same plane.

The face of the semiconductor device 11B on the side opposed to the semiconductor device 11A is made a flat face. The internal connection terminals 13 are connected to the pad part 42 of the semiconductor device 11B and the pad part 47 of the semiconductor device 11A. Accordingly, the internal connection terminals 13 electrically connect the semiconductor device 11A with the semiconductor device 11B.

According to the electronic device 10 of the exemplary embodiment, the internal connection terminals 13 electrically connecting the semiconductor device 11A with the semiconductor device 11B are provided between the semiconductor device 11A in each portion of a small step and the flat face of the semiconductor device 11B, whereby it is possible to reduce the diameter of each of the internal connection terminals 13, so that the electronic device 10 can be downsized in the thickness direction.

The diameter of the internal connection terminal 13 is reduced, whereby it is possible to place the through electrodes 33 at a narrow pitch and thus the number of electric connection parts between the semiconductor device 11A and the semiconductor device 11B can be increased. In other words, the number of internal connection terminals 13 placed between the semiconductor devices 11A and 11B can be increased.

The semiconductor devices 11A and 11B downsized in the thickness direction are stacked, whereby the electronic device 10 can be downsized in the thickness direction.

For example, a solder ball can be used as the internal connection terminal 13. The diameter of the internal connection terminal 13 can be set to 100 μm, for example.

One or more additional semiconductor devices 11B may be stacked on the electronic device 10 through the internal connection terminals 13. Thus, an additional semiconductor device 11B is stacked on the electronic device 10, so that the packing density of the electronic device 10 can be improved.

Figure 3:
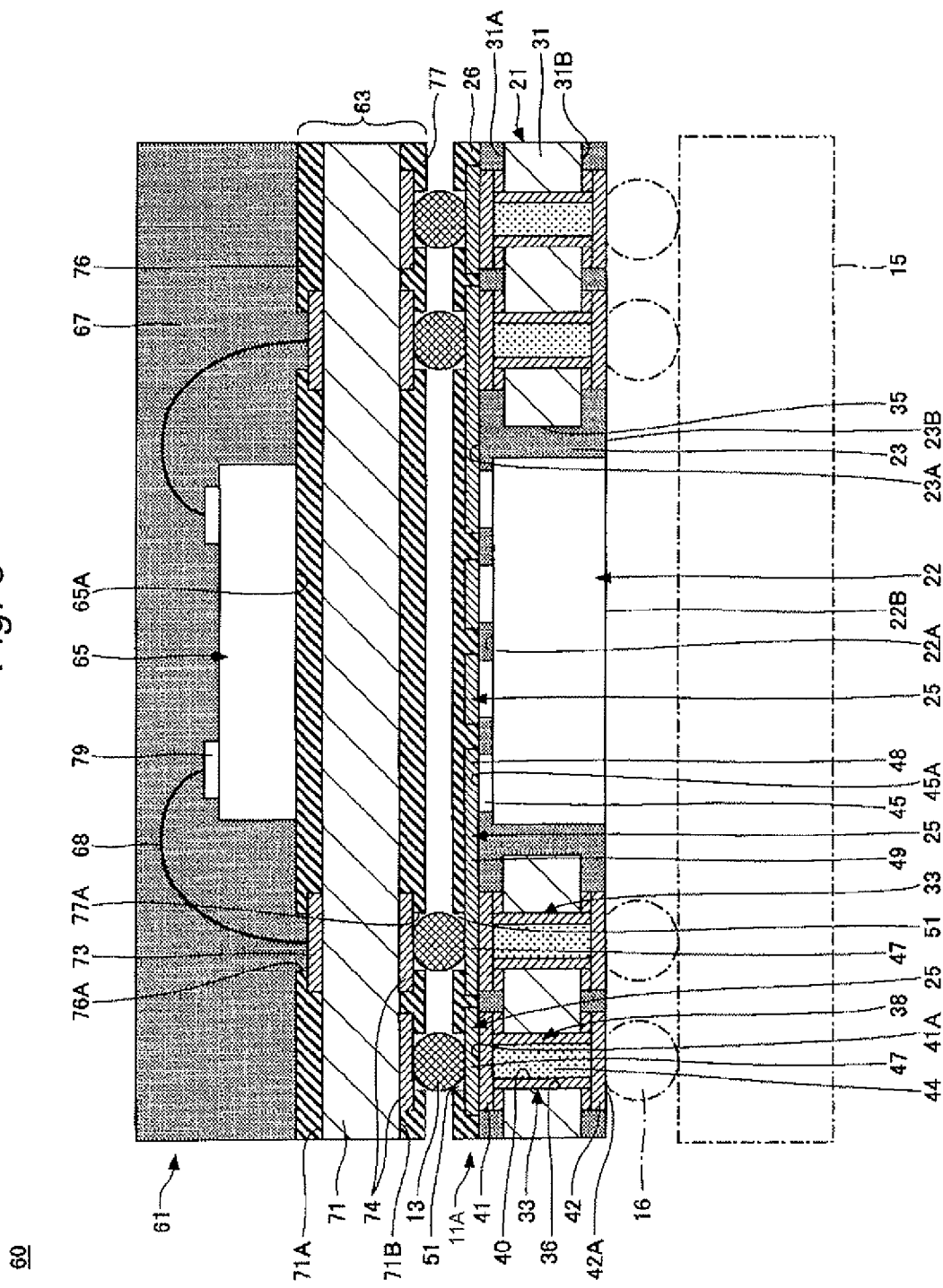
FIG. 3 is a sectional view showing an electronic device according to a modified example of the first exemplary embodiment of the invention.

FIG. 3 is a sectional view showing an electronic device according to a modified example of the first exemplary embodiment. Components identical with those of the electronic device 10 of the first exemplary embodiment are denoted by the same reference numerals in FIG. 3.

In FIG. 3, an electronic device 60 according to the modified example of the first exemplary embodiment has a similar configuration to that of the electronic device 10 except that a semiconductor device 61 is provided in place of the semiconductor device 11B provided in the electronic device 10 of the first exemplary embodiment.

The semiconductor device 61 has a wiring board 63, an electronic component 65, and mold resin 67. The wiring board 63 has a board main body 71, pads 73 and 74, and solder resist layers 76 and 77.

The board main body 71 is shaped like a board. For example, a stacked body having multiple insulating resin layers (for example, epoxy resin layers) deposited on each other is used as the board main body 71.

The pad 73 is provided on an upper face 71A of the board main body 71. The pad 73 is connected to a wiring pattern (not shown) internally provided in the board main body 71 and is also connected to one end part of a metal wire 68 (for example, an Au wire). The pad 73 is electrically connected to the electronic component 65 through the metal wire 68. For example, Cu can be used as a material of the pad 73.

The pad 74 is provided on a lower face 71B of the board main body 71. The pad 74 is connected to the wiring pattern (not shown) internally provided in the board main body 71. Accordingly, the pad 74 is electrically connected to the pad 73 through the wiring pattern (not shown). The pad 74 is placed so as to be opposed to the pad part 47 provided in the semiconductor device 11A. The pad 74 is connected to the internal connection terminal 13 connected to the pad part 47. Accordingly, the semiconductor device 61 is electrically connected to the semiconductor device 11A through the internal connection terminal 13. For example, Cu can be used as a material of the pad 74.

The solder resist layer 77 is provided on the upper face 71A of the board main body 71. The solder resist layer 76 has an opening 76A exposing an upper face of the pad 73.

The solder resist layer 76 is provided on the lower face 71B of the board main body 71. The solder resist layer 77 has an opening 77A exposing a lower face of the pad 74.

The electronic component 65 has multiple electrode pads 79. The electronic component 65 is adhered onto the solder resist layer 76 so that a face 65A of the electronic component 65 on a side where the electrode pads 79 are not formed and an upper layer of the solder resist layer 76 come in contact with each other. The electrode pad 79 is connected to an opposite end of the metal wire 68. Accordingly, the electronic component 65 is electrically connected to the wiring board 63 through the metal wire 68. For example, a memory semiconductor chip can be used as the electronic component 65.

The mold resin 67 is provided on an upper face of the pad 73 and an upper face of the solder resist layer 76 so as to cover the electronic component 65 and the metal wire 68. The mold resin 67 is resin for sealing the electronic component 65 and the metal wire 68. For example, epoxy resin can be used as a material of the mold resin 67.

The semiconductor device 61 having a different configuration from the semiconductor device 11A may be stacked on the semiconductor device 11A as with the electronic device 60 described above.

Also in the electronic device 60 described above, the diameter of each of the internal connection terminals 13 electrically connecting the semiconductor device 11A with the semiconductor device 61 can be reduced, so that the electronic device 60 can be downsized in the thickness direction.

The diameter of the internal connection terminal 13 is reduced, whereby it is possible to place the through electrodes 33 at a narrow pitch and thus the number of electric connection parts between the semiconductor device 11A and the semiconductor device 61 can be increased. In other words, the number of internal connection terminals 13 placed between the semiconductor devices 11A and 61 can be increased.

FIGS. 4 to 11 are diagrams showing a manufacturing process of the semiconductor device according to the first exemplary embodiment. Components identical with those of the semiconductor device 11A of the first exemplary embodiment are denoted by the same reference numerals in FIGS. 4 to 11.

A manufacturing method of the semiconductor device 11A of the first exemplary embodiment will be discussed with reference to FIGS. 4 to 11.

Figure 4:
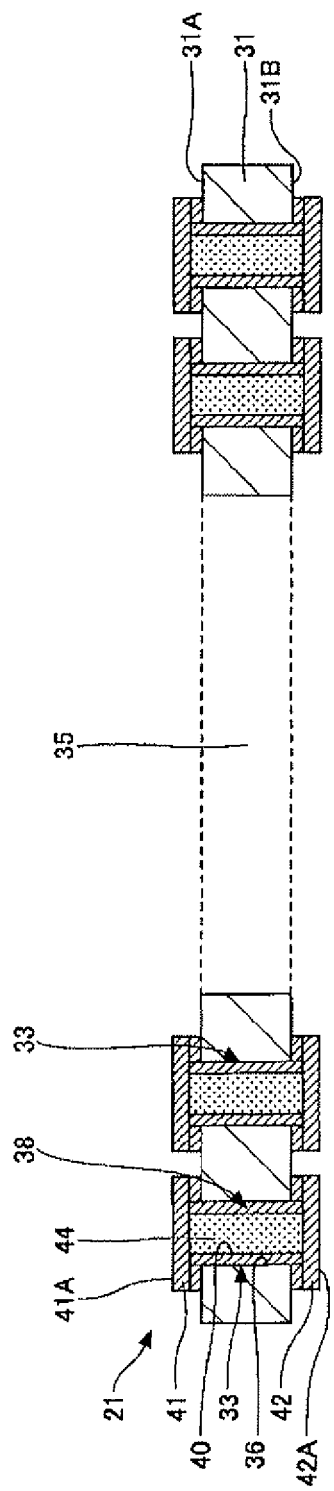
FIG. 4 is a diagram showing a manufacturing process of the semiconductor device (No. 1)

To begin with, in the step shown in FIG. 4, a wiring board 21 including a multilayer wiring structure 31 having a through part 35 and through electrodes 33 each provided so as to penetrate the multilayer wiring structure 31, having a first connection face 41A exposed from a face 31A (first face) of the multilayer wiring structure 31 and a second connection face 42A exposed from a face 31B (second face) of the multilayer wiring structure 31, and electrically connected to the multilayer wiring structure 31 is formed according to a related art (wiring board forming step).

The wiring board 21 can be provided by forming a through hole 36 in a glass epoxy substrate by drilling, for example, and next forming the through electrodes 33 by a plated film and filling resin 44 into the through hole 36 and further forming the through part 35 by punching.

Figure 5:
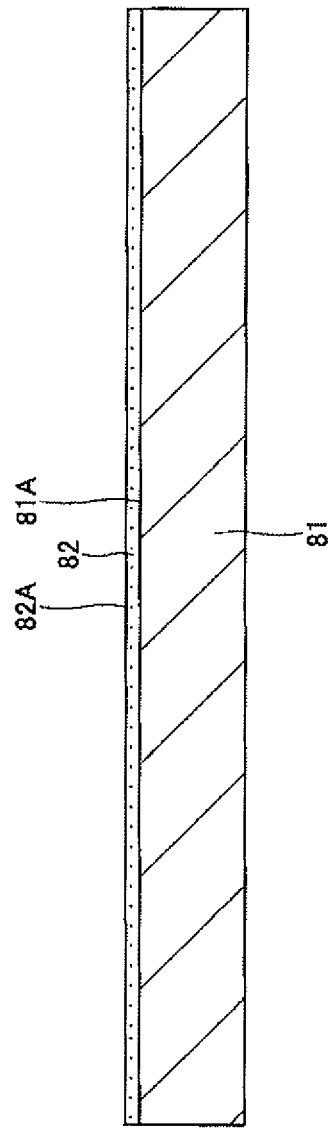
FIG. 5 is a diagram showing the manufacturing process of the semiconductor device (No. 2)

Next, in the step shown in FIG. 5, an adhesive 82 is formed on a face 81A of a support 81. For example, a silicon substrate, a metal plate (for example, a Cu plate), a glass plate, etc., can be used as the support 81. A thickness of the support 81 can be set to 300 to 600 μm, for example. For example, a vinyl chloride based adhesive can be used as the adhesive 82.

Figure 6:
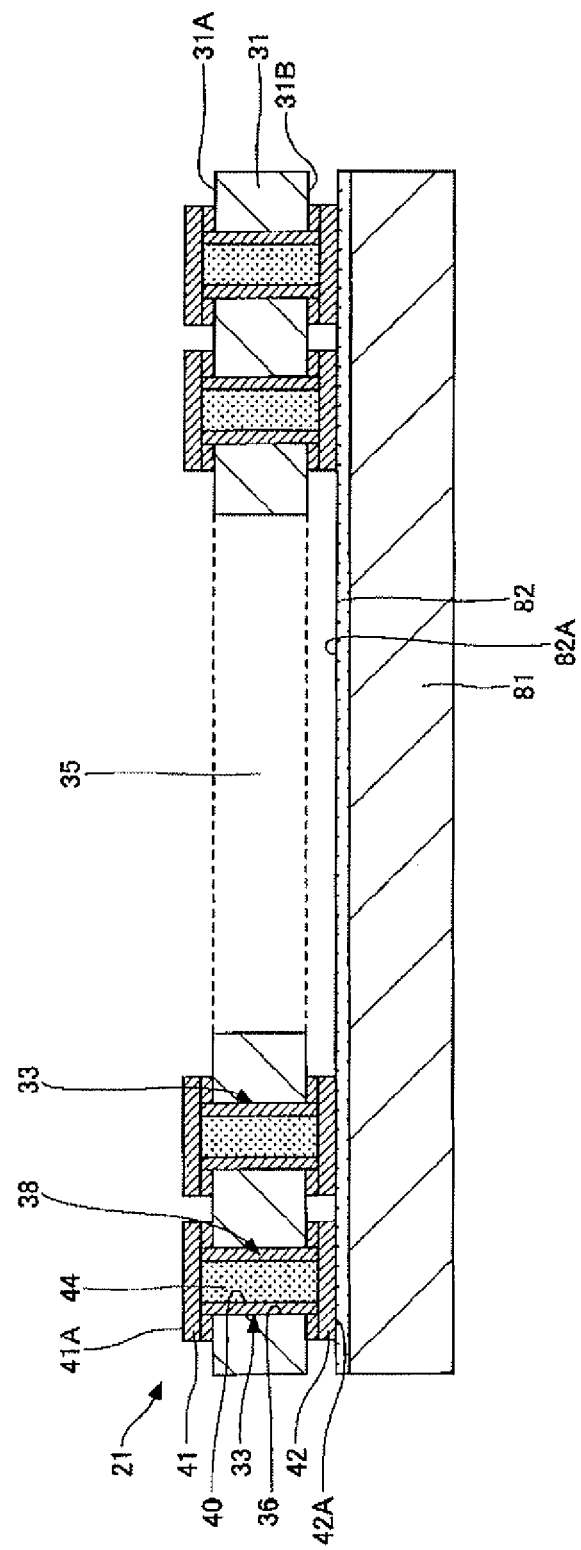
FIG. 6 is a diagram showing the manufacturing process of the semiconductor device (No. 3)

Next, in the step shown in FIG. 6, the wiring board 21 shown in FIG. 4 is adhered to the support 81 shown in FIG. 5 with the adhesive 82 so that the second connection face 42A and a face 82A of the adhesive 82 come in contact with each other (wiring board adhering step).

Figure 7:
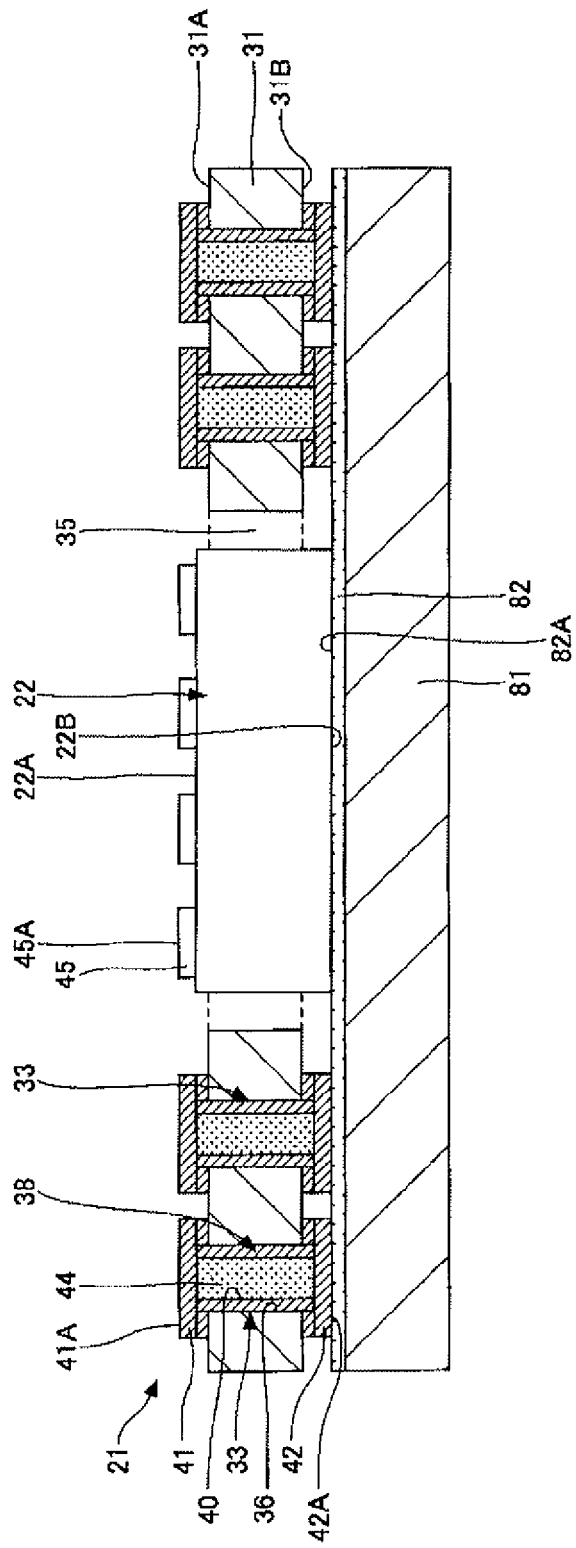
FIG. 7 is a diagram showing the manufacturing process of the semiconductor device (No. 4)

Next, in the step shown in FIG. 7, an electronic component 22 having electrode pads 45 each having a connection face 45A, an electrode pad forming face 22A where the electrode pads 45 are formed, and a rear face 22B placed on the opposite side to the electrode pad forming face 22A is prepared and then the face 82A of the adhesive 82 in the portion exposed from the through part 35 and the rear face 22B of the electronic component 22 are adhered so that the connection faces 45A is substantially on the same plane as the first connection faces 41A provided on the through electrodes 33 (electronic component adhering step).

Thus, the electronic component 22 is housed in the through part 35 so that the connection faces 45A is substantially on the same plane as the first connection faces 41A, whereby projecting of the electronic component 22 from the first connection faces 41A of the through electrodes 33 is eliminated, so that the semiconductor device 11A can be downsized in the thickness direction.

The thickness of the electronic component 22 is formed is substantially equal to the value of the depth of the through electrode 33. The thickness of the electronic component 22 can be set to 300 μm, for example.

Thus, the thickness of the electronic component 22 is made substantially equal to the value of the depth of the through electrode 33, whereby it is possible to make the rear face 22B of the electronic component 22 planar with the second connection face 42A. Accordingly, projecting of the electronic component 22 housed in the through part 35 from both ends of the through electrode 33 is eliminated, so that the semiconductor device 11A can be further downsized in the thickness direction.

For example, a CPU semiconductor chip can be used as the electronic component 22.

Figure 8:
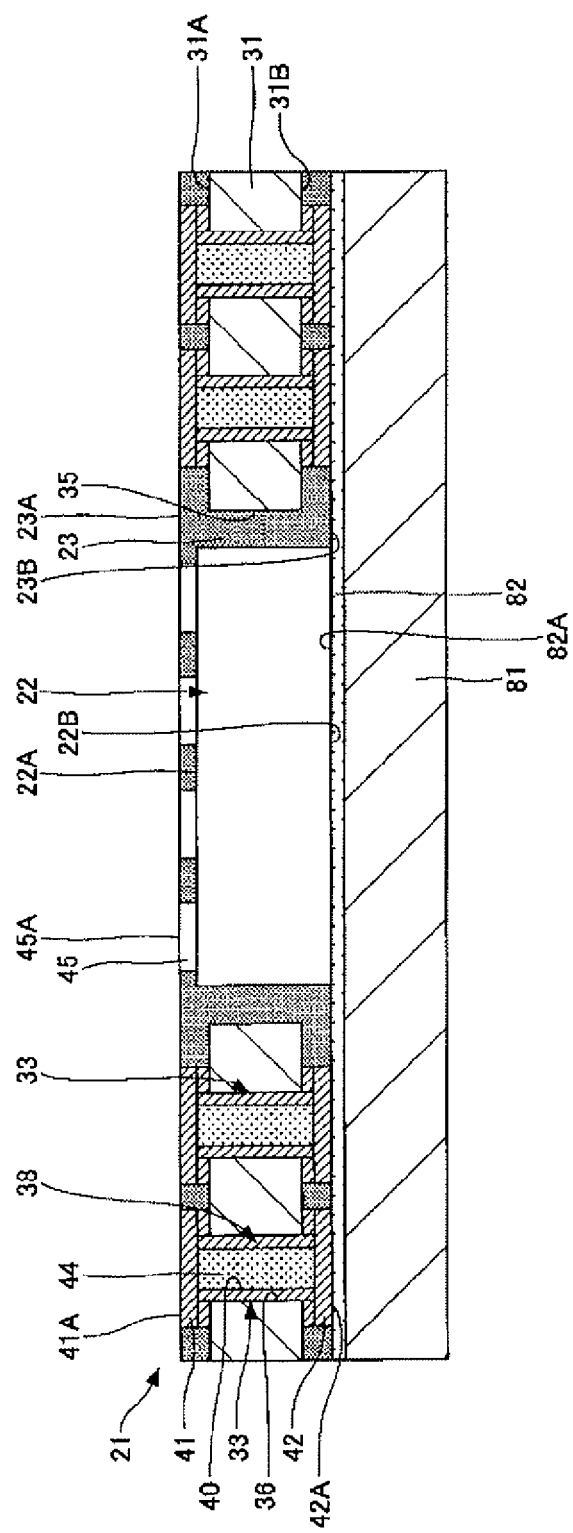
FIG. 8 is a diagram showing the manufacturing process of the semiconductor device (No. 5)

Next, in the step shown in FIG. 8, seal resin 23 for sealing the electronic component 22 in the through part 35, the electrode pad forming face 22A, and the face 31A of the multilayer wiring structure 31 and having a face 23A (first plane) exposing the first connection faces 41A and the connection faces 45A and a face 23B exposing the rear face 22B of the electronic component 22 and the second connection face 42A and made planar with the rear face 22B and the second connection face 42A is formed (seal resin forming step).

Specifically, the seal resin 23 is formed, for example, by potting resin of epoxy, etc., (base material of the seal resin 23) or a transfer mold method and then is formed by grinding redundant resin until the first connection faces 41A and the connection faces 45A are exposed.

The seal resin 23 may be formed so that the face 23A of the seal resin 23 is made planar with the first connection faces 41A and the connection faces 45A.

Thus, the face 23A of the seal resin 23 is made planar with the first connection faces 41A and the connection faces 45A, whereby the wiring pattern 25 connected to the first connection faces 41A and the connection faces 45A can be formed with good accuracy on the face 23A of the seal resin 23, the connection face 45A, and the first connection faces 41A.

For example, a mold compound of epoxy, etc., an epoxy sheet, etc., can be used as a material of the seal resin 23. The thickness of the seal resin 23 is made substantially equal to the thickness of the electronic component 22. The thickness of the seal resin 23 can be set to 300 μm, for example.

As the grinding method of the seal resin 23, for example, mechanical grinding (for example, grinding using sand paper), chemical grinding (for example, wet etching), physical grinding (for example, plasma etching), etc., can be used.

Figure 9:
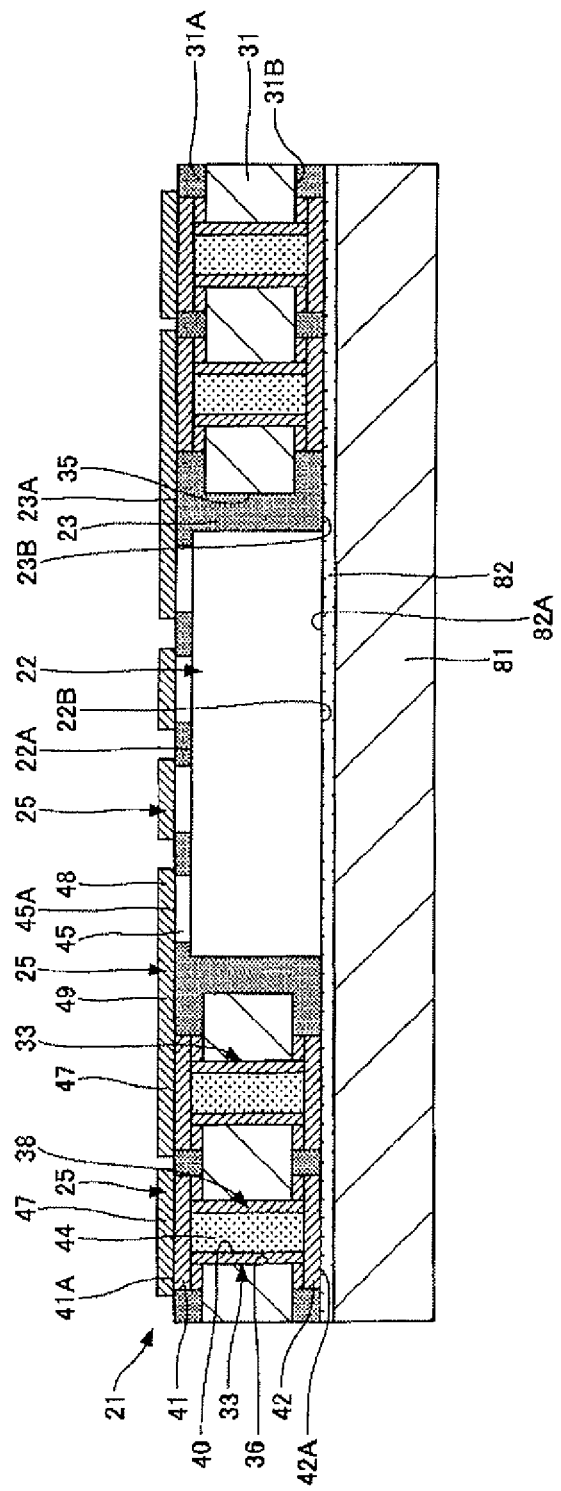
FIG. 9 is a diagram showing the manufacturing process of the semiconductor device (No. 6)

Next, in the step shown in FIG. 9, the electrode pads 45 and the through electrode 33 are electrically connected to the first connection faces 41A, the connection face 45A, and the face 23A of the seal resin 23, and the wiring pattern 25 having pad parts 47 and 48 and a wiring part 49 is formed (wiring pattern forming step).

Accordingly, the pad part 47 forming a part of the wiring pattern 25 is connected directly to the first connection face 41A of the through electrode 33. The pad part 48 forming a part of the wiring pattern 25 is connected directly to the connection face 45A of the electrode pad 45.

Thus, the pad part 48 forming a part of the wiring pattern 25 is connected directly to the connection face 45A of the electrode pad 45 without the intervention of a bump, whereby the electric connection reliability between the through electrode 33 and the electronic component 22 can be improved.

The wiring pattern 25 can be formed according to a subtractive process or a semi-additive process, for example. For example, Cu can be used as a material of the wiring pattern 25.

Figure 10:
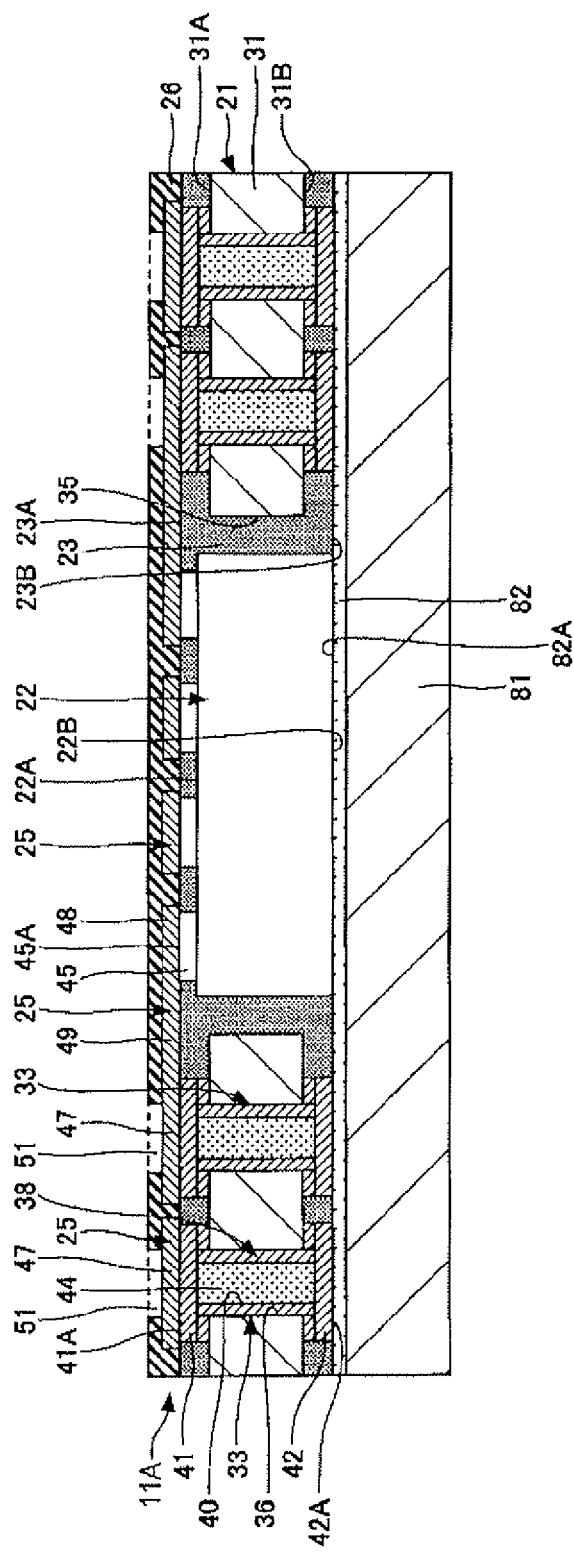
FIG. 10 is a diagram showing the manufacturing process of the semiconductor device (No. 7)

Next, in the step shown in FIG. 10, a solder resist layer 26 having an opening 51 exposing the pad part 47 is formed on the face 23A of the seal resin 23 and the wiring pattern 25 (solder resist layer forming step).

Accordingly, a structure corresponding to the semiconductor device 11A is formed on the support 81 formed with the adhesive 82.

Figure 11:
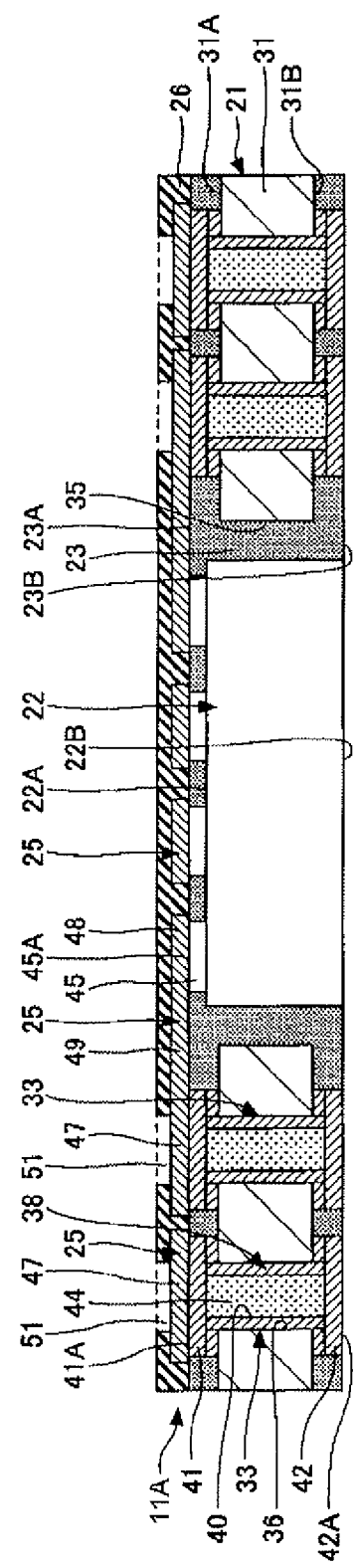
FIG. 11 is a diagram showing the manufacturing process of the semiconductor device (No. 8)

Next, in the step shown in FIG. 11, the adhesive 82 and the support 81 are removed from the semiconductor device 11A shown in FIG. 10 (adhesive and support removing step). Accordingly, the semiconductor device 11A of the first exemplary embodiment is manufactured. The semiconductor device 11B can be manufactured according to a similar technique to the manufacturing method of the semiconductor device 11A described above (see the steps shown in FIGS. 4 to 11).

According to the manufacturing method the semiconductor device of the exemplary embodiment, the wiring board 21 including the multilayer wiring structure 31 having the through part 35 and the through electrodes 33 provided so as to penetrate the multilayer wiring structure 31, having the first connection face 41A and the second connection face 42A, and electrically connected to the multilayer wiring structure 31 is formed. Next, the wiring board 21 is adhered to the support 81 with the adhesive 82 so that the second connection face 42A and the face 82A of the adhesive 82 come in contact with each other. Then, the electronic component 22 having the thickness substantially equal to the value of the height of the through electrode 33 is prepared. And then, the adhesive 82 in the portion exposed from the through part 35 and the electronic component 22 are adhered so that the connection faces 45A of the electronic component 22 is substantially on the same plane as the first connection faces 41A. Next, the seal resin 23 sealing the electronic component 22 in the through part 35, the electrode pad forming face 22A of the electronic component 22, and both faces 31A and 31B of the multilayer wiring structure 31 and having the face 23A exposing the first connection faces 41A and the connection faces 45A is formed. Then, the wiring pattern 25 electrically connecting the electrode pads 45 of the electronic component 22 and the through electrode 33 to the first connection faces 41A, the connection faces 45A, and the face 23A of the seal resin 23 and having the pad part 47 is formed. And then, the solder resist layer 26 having the opening 51 exposing the pad part 47 is formed. Finally, the adhesive 82 and the support 81 are removed, whereby projecting of the electronic component 22 from the first and second connection faces 41A and 42A of the through electrodes 33 is eliminated, so that the semiconductor device 11A can be downsized in the thickness direction.

The wiring pattern 25 and the electrode pads 45 are directly connected without the intervention of a bump, whereby the electric connection reliability between the through electrode 33 and the electronic component 22 can be improved.

FIGS. 12 to 17 are diagrams showing a modified example of the manufacturing process of the semiconductor device according to the first exemplary embodiment. Components identical with those of the semiconductor device 11A of the first exemplary embodiment are denoted by the same reference numerals in FIGS. 12 to 17.

A manufacturing method according to the modified example of the semiconductor device 11A of the first exemplary embodiment will be discussed with reference to FIGS. 12 to 17.

Figure 12:
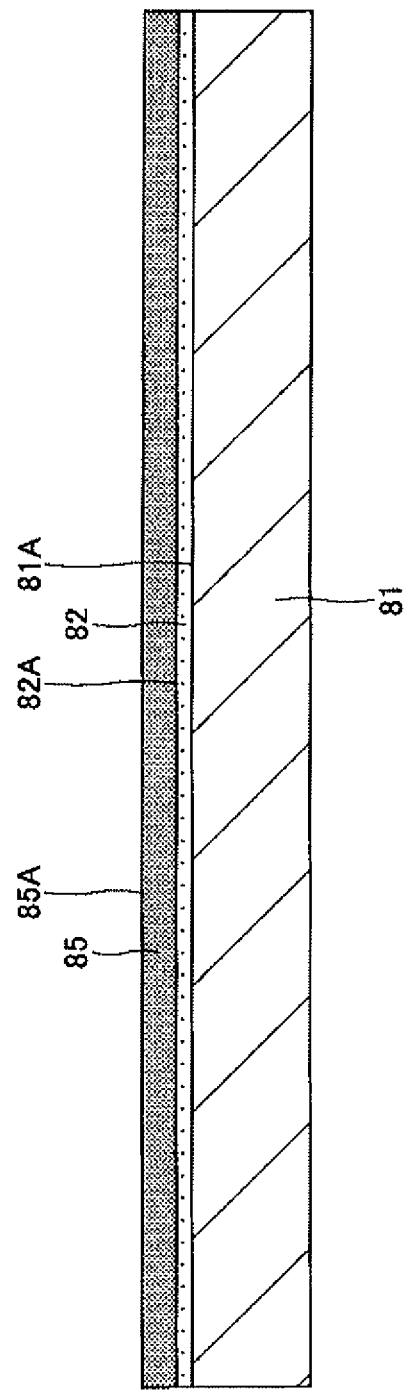
FIG. 12 is a diagram showing a modified example of the manufacturing process of the semiconductor device (No. 1)

First, in the step shown in FIG. 12, a semi-cured resin sheet 85 is put on the adhesive 82 previously described with reference to FIG. 5.

Figure 13:
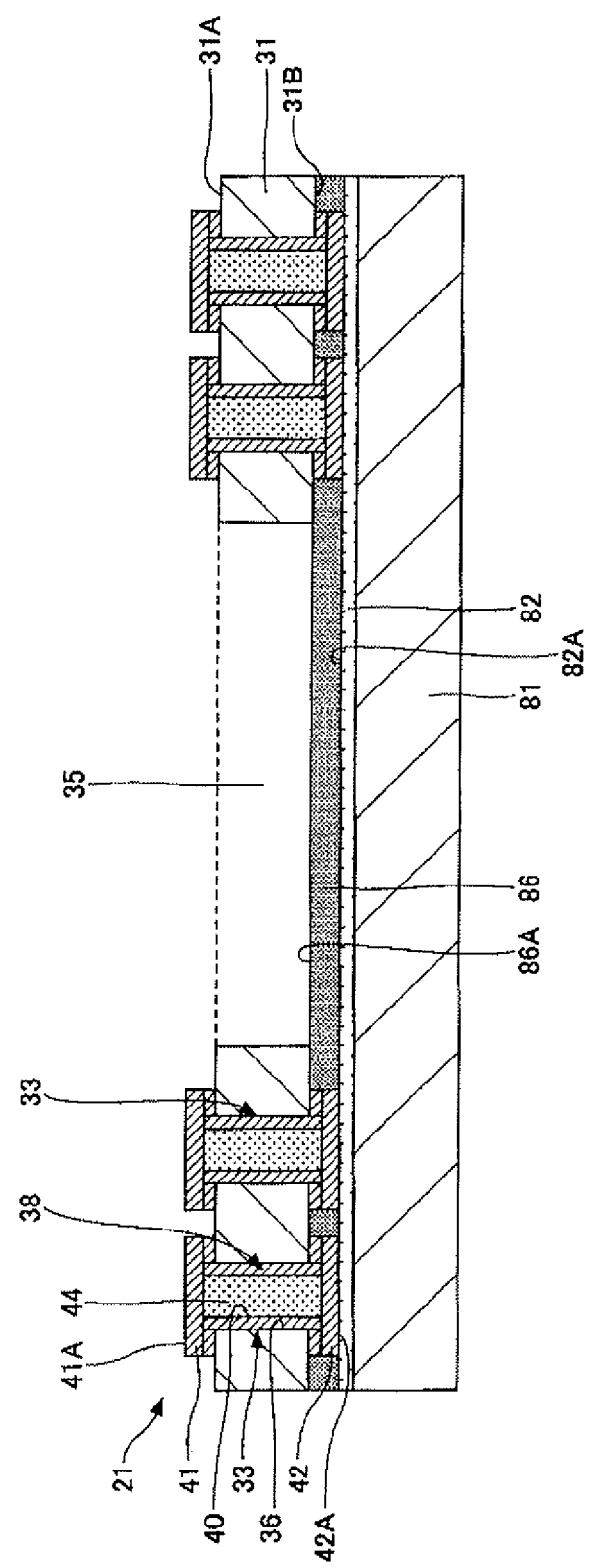
FIG. 13 is a diagram showing the modified example of the manufacturing process of the semiconductor device (No. 2)

The resin sheet 85 is a member which becomes a base material of first seal resin 86 later described with reference to FIG. 13. For example, an epoxy resin can be used as a material of the resin sheet 85. A thickness of the resin sheet 85 can be set to 20 to 30 µm, for example. The steps shown in FIGS. 5 and 12 are steps corresponding to "adhesive and resin sheet forming step."

Next, in the step shown in FIG. 13, the wiring board 21 previously described with reference to FIG. 4 is placed on the resin sheet 85 shown in FIG. 12 and then the wiring board 21 is pressed until the second connection face 42A and the face 82A of the adhesive 82 come in contact with each other and the face 31B of the multilayer wiring structure 31 and a face 85A of the resin sheet 85 come in contact with each other, and the resin sheet 85 is completely cured by heating. Accordingly, the first seal resin 86 sealing a side face of the through electrode 33 in the portion projected from the face 31B of the multilayer wiring structure 31 and the face 31B of the multilayer wiring structure 31 and closing a bottom face of the through part 35 is formed (first seal resin forming step).

Accordingly, a face 86A of the first seal resin 86 in the portion exposed from the through part 35 becomes the bottom face of the through part 35. The face 86A of the first seal resin 86 in the portion not exposed from the through part 35 comes in contact with the face 31B of the multilayer wiring structure 31. The first seal resin 86 is seal resin forming a part of the seal resin 23 previously described in FIG. 2.

Thus, the face 31B of the multilayer wiring structure 31 is sealed so as to close the bottom face of the through part 35 by the first seal resin 86 before the through part 35 and the face 31A of the multilayer wiring structure 31 are sealed (in other words, the through part 35 and the faces 31A and 31B of the multilayer wiring structure 31 are sealed twice separately), whereby the through part 35 and the faces 31A and 31B of the multilayer wiring structure 31 can be reliably sealed (even a minute gap can be sealed reliably).

Particularly, it is effective if a resin sheet or a resin material having a high viscosity is used as a base material of second seal resin 88 later described with reference to FIG. 15.

Figure 14:
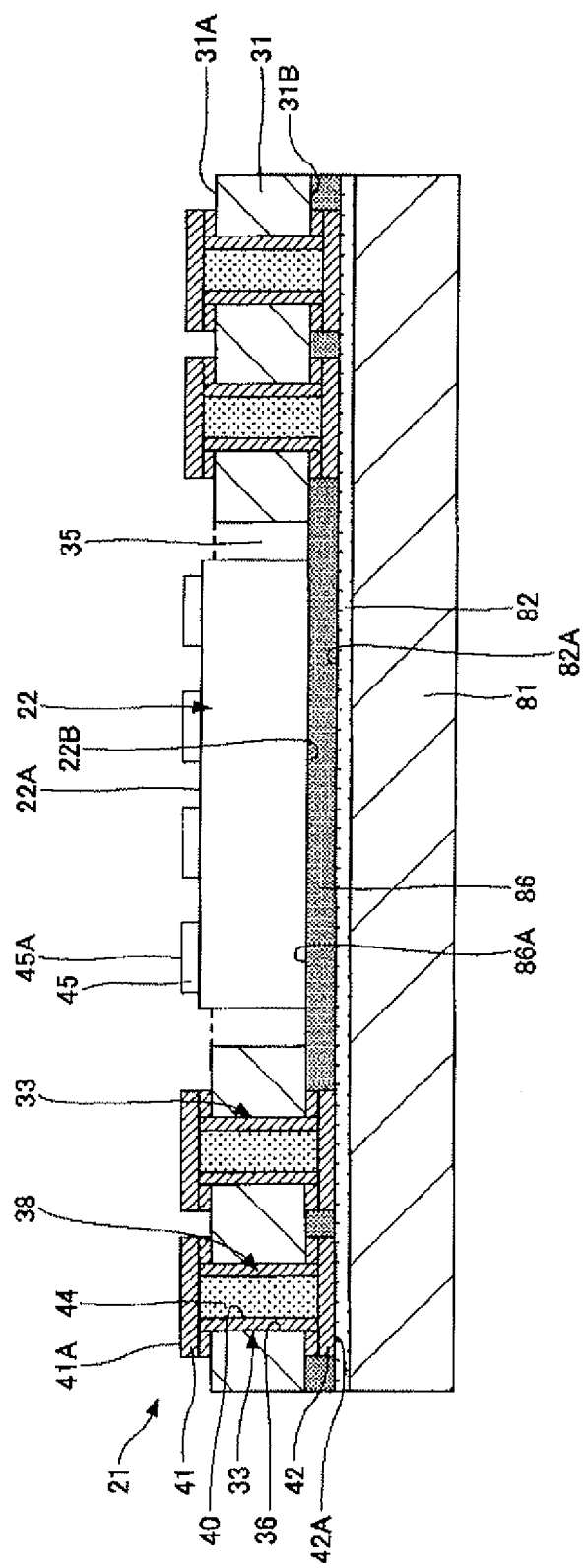
FIG. 14 is a diagram showing the modified example of the manufacturing process of the semiconductor device (No. 3)

Next, in the step shown in FIG. 14, the electronic component 22 having the electrode pads 45 each having the connection face 45A, the electrode pad forming face 22A where the electrode pads 45 are formed, and the rear face 22B placed on the opposite side to the electrode pad forming face 22A is prepared. Next, the face 86A of the first seal resin 86 in the portion exposed from the through part 35 and the rear face 22B of the electronic component 22 are brought into contact with each other so that the connection faces 45A are substantially on the same plane as the first connection faces 41A, whereby the electronic component 22 is placed in the through part 35 (electronic component placing step).

Thus, the electronic component 22 is placed on the face 86A of the first seal resin 86 in the portion exposed from the through part 35 so that the connection faces 45A are substantially on the same plane as the first connection faces 41A, whereby projecting of the electronic component 22 from the first and second connection faces 41A and 42A of the through electrodes 33 is eliminated, so that the semiconductor device 11A can be downsized in the thickness direction.

In this case, the thickness of the electronic component 22 can be set to 300 µm, for example. For example, a CPU semiconductor chip can be used as the electronic component 22.

Figure 15:
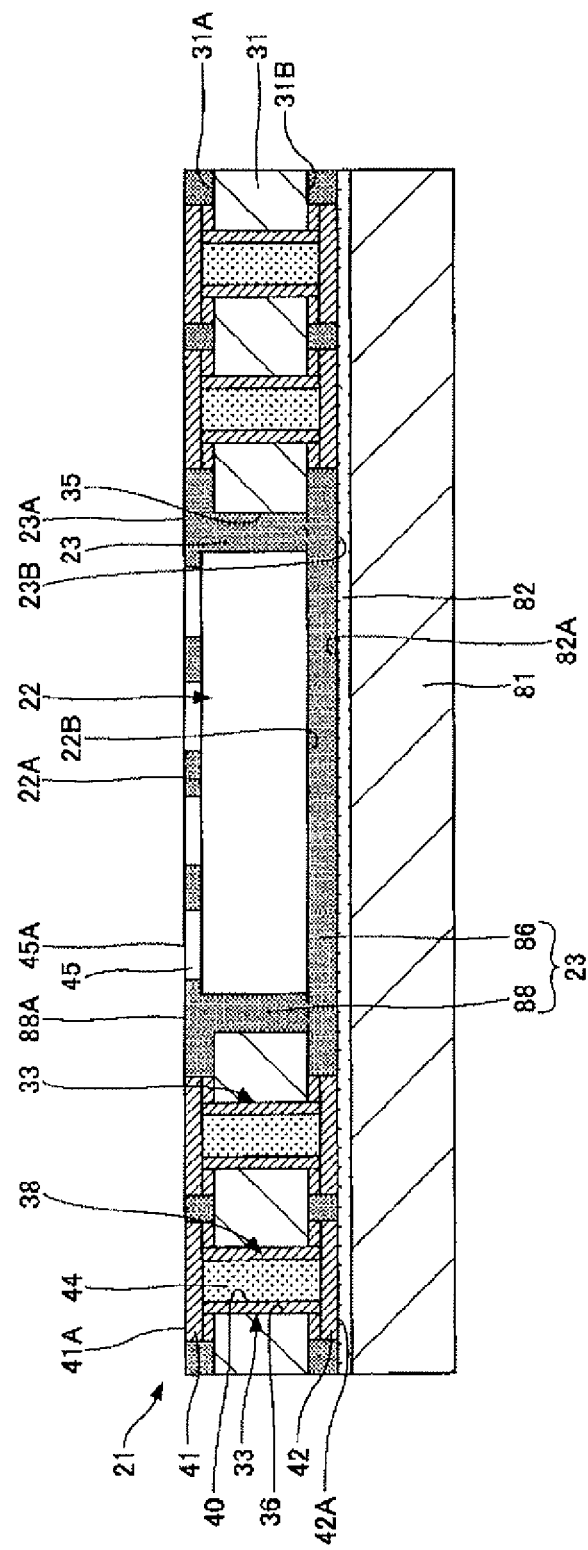
FIG. 15 is a diagram showing the modified example of the manufacturing process of the semiconductor device (No. 4)

Next, in the step shown in FIG. 15, the second seal resin 88 sealing the electronic component 22 in the through part 35, the electrode pad forming face 22A, and the face 31A of the multilayer wiring structure 31 and having a face 88A (first plane) exposing the first connection faces 41A and the connection faces 45A is formed (second seal resin forming step).

Specifically, the second seal resin 88 is formed by heating and pressurizing a resin sheet or a resin material having a high viscosity (base material of the second seal resin 88). For example, an epoxy resin can be used as a material of the second seal resin 88.

In the second seal resin forming step, the second seal resin 88 may be formed so that the face 88A of the second seal resin 88 is made planar with the first connection faces 41A and the connection faces 45A.

Thus, the face 88A of the second seal resin 88 is made planar with the first connection faces 41A and the connection faces 45A, whereby the wiring pattern 25 connected to the connection faces 45A and the first connection faces 41A can be formed with good accuracy on the face 88A of the second seal resin 88, the connection face 45A, and the first connection faces 41A.

Next, in the step shown in FIG. 16, the electrode pads 45 and the through electrodes 33 are electrically connected to the first connection faces 41A, the connection face 45A, and the face 88A of the second seal resin 88 and the wiring pattern 25 having the pad parts 47 and 48 and the wiring part 49 is formed according to a similar technique to the step previously described with reference to FIG. 9 (wiring pattern forming step).

Next, similar processing to the step previously described with reference to FIG. 10 is performed, whereby the solder resist layer 26 having the opening 51 exposing the pad part 47 is formed on the face 88A of the second seal resin 88 and the wiring pattern 25 (solder resist layer forming step).

Accordingly, a structure corresponding to the semiconductor device 11A is formed on the support 81 formed with the adhesive 82.

Figure 16:
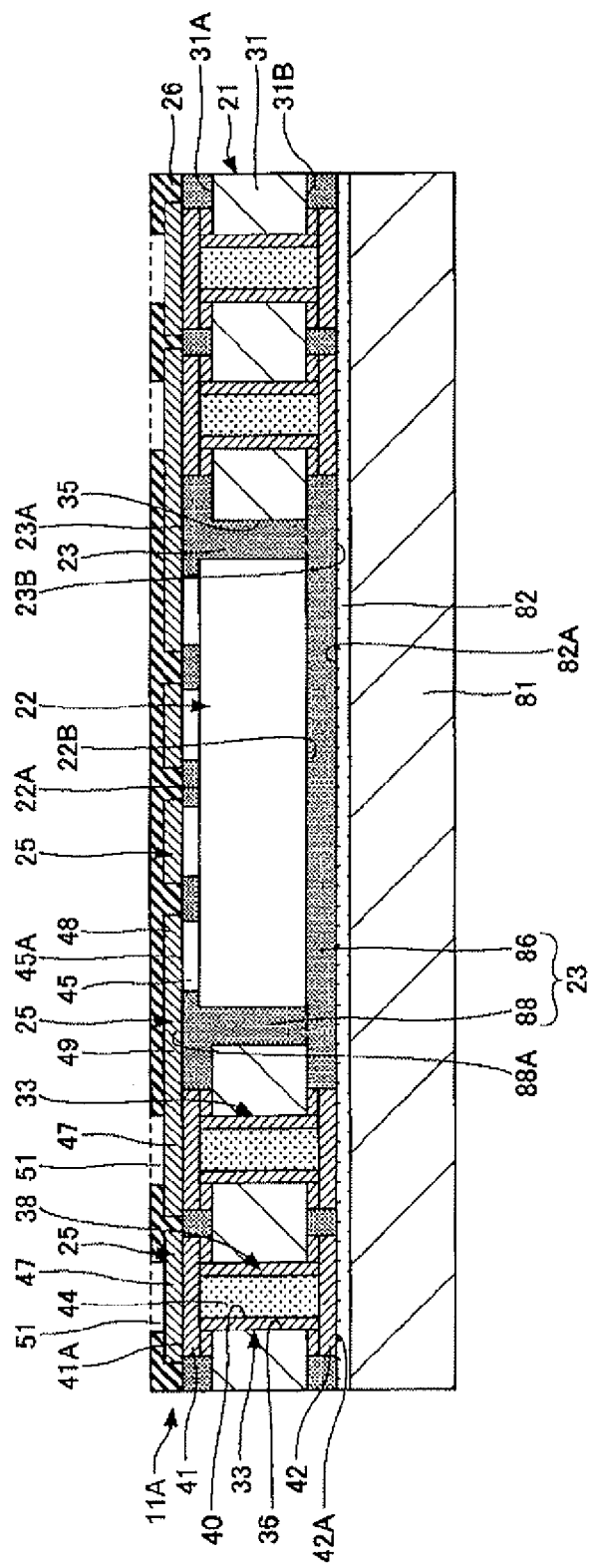
FIG. 16 is a diagram showing the modified example of the manufacturing process of the semiconductor device (No. 5)
Figure 17:
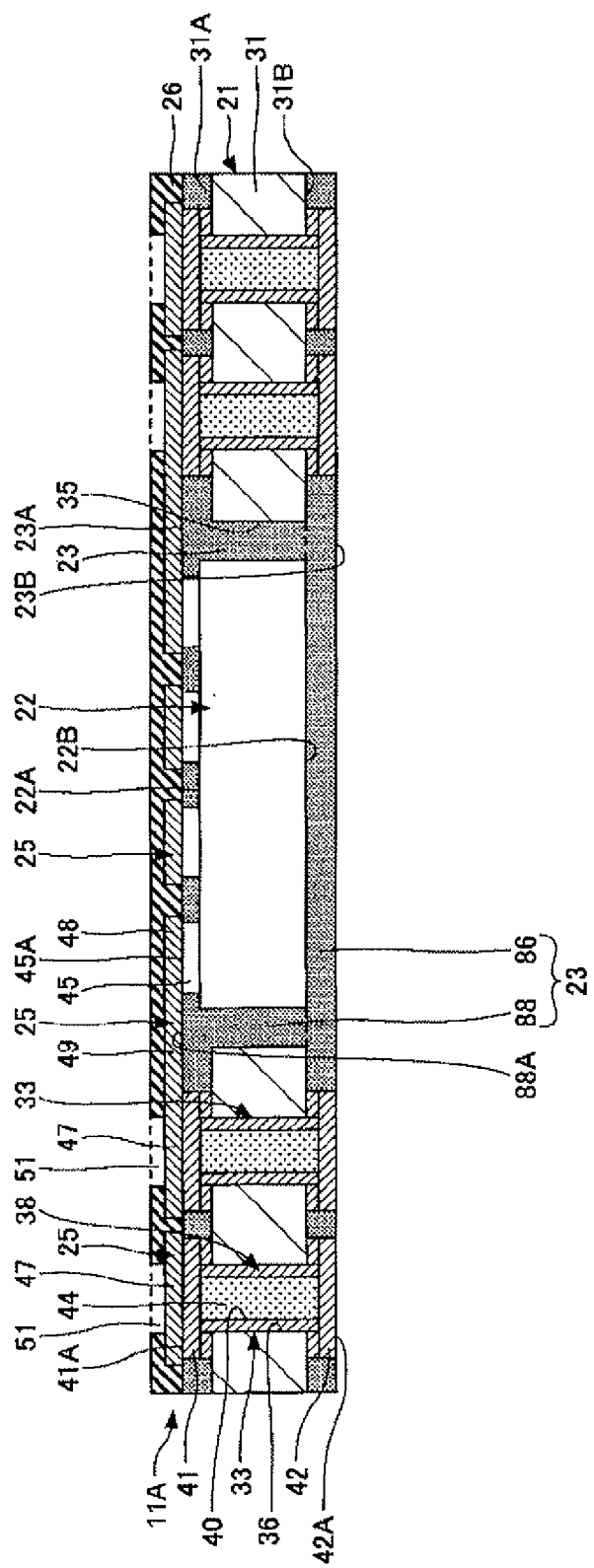
FIG. 17 is a diagram showing the modified example of the manufacturing process of the semiconductor device (No. 6)

Next, in the step shown in FIG. 17, the adhesive 82 and the support 81 are removed from the semiconductor device 11A shown in FIG. 16 (adhesive and support removing step). Accordingly, the semiconductor device 11A of the first exemplary embodiment is manufactured. The semiconductor device 11B can be manufactured according to a similar manufacturing method of the semiconductor device 11A described above (see the steps shown in FIGS. 12 to 17).

According to the modified example of the manufacturing method the semiconductor device of the exemplary embodiment, the wiring board 21 including the multilayer wiring structure 31 having the through part 35 and the through electrodes 33 provided so as to penetrate the multilayer wiring structure 31 and having the first and second connection faces 41A and 42A is formed. Then, the adhesive 82 and the semi-cured resin sheet 85 are formed in order on the face 81A of the support 81. Next, the wiring board 21 is pressed, the adhesive 82 and the second connection face 42A are brought into contact with each other, and the semi-cured resin sheet 85 is completely cured, whereby the first seal resin 86 sealing a side face of the through electrode 33 in the portion projected from the face 31B of the multilayer wiring structure 31 and the face 31B of the multilayer wiring structure 31 and closing the bottom face of the through part 35 is formed. Then, the first seal resin 86 in the portion exposed from the through part 35 and the rear face 22B of the electronic component 22 are brought into contact with each other so that the connection faces 45A of the electronic component 22 are substantially on the same plane as the first connection faces 41A, whereby the electronic component 22 is placed in the through part 35. Next, the second seal resin 88 sealing the electronic component 22 in the through part 35, the electrode pad forming face 22A, and the face 31A of the multilayer wiring structure 31 and having the face 88A exposing the first connection faces 41A and the connection faces 45A is formed, whereby the through part 35 and the faces 31A and 31B of the multilayer wiring structure 31 can be reliably sealed.

Projecting of the electronic component 22 from the first and second connection faces 41A and 42A of the through electrodes 33 is eliminated, so that the semiconductor device 11A can be downsized in the thickness direction.

Further, after the second seal resin 88 is formed, the wiring pattern 25 electrically connecting the electrode pads 45 and the through electrode 33 to the first connection faces 41A, the connection faces 45A, and the face 88A of the second seal resin 88 is formed, whereby it is possible to electrically connect the wiring pattern 25 with the electrode pads 45 without the intervention of a bump, so that the electric connection reliability between the through electrode 33 and the electronic component 22 can be improved.

Second Exemplary Embodiment

Figure 18:
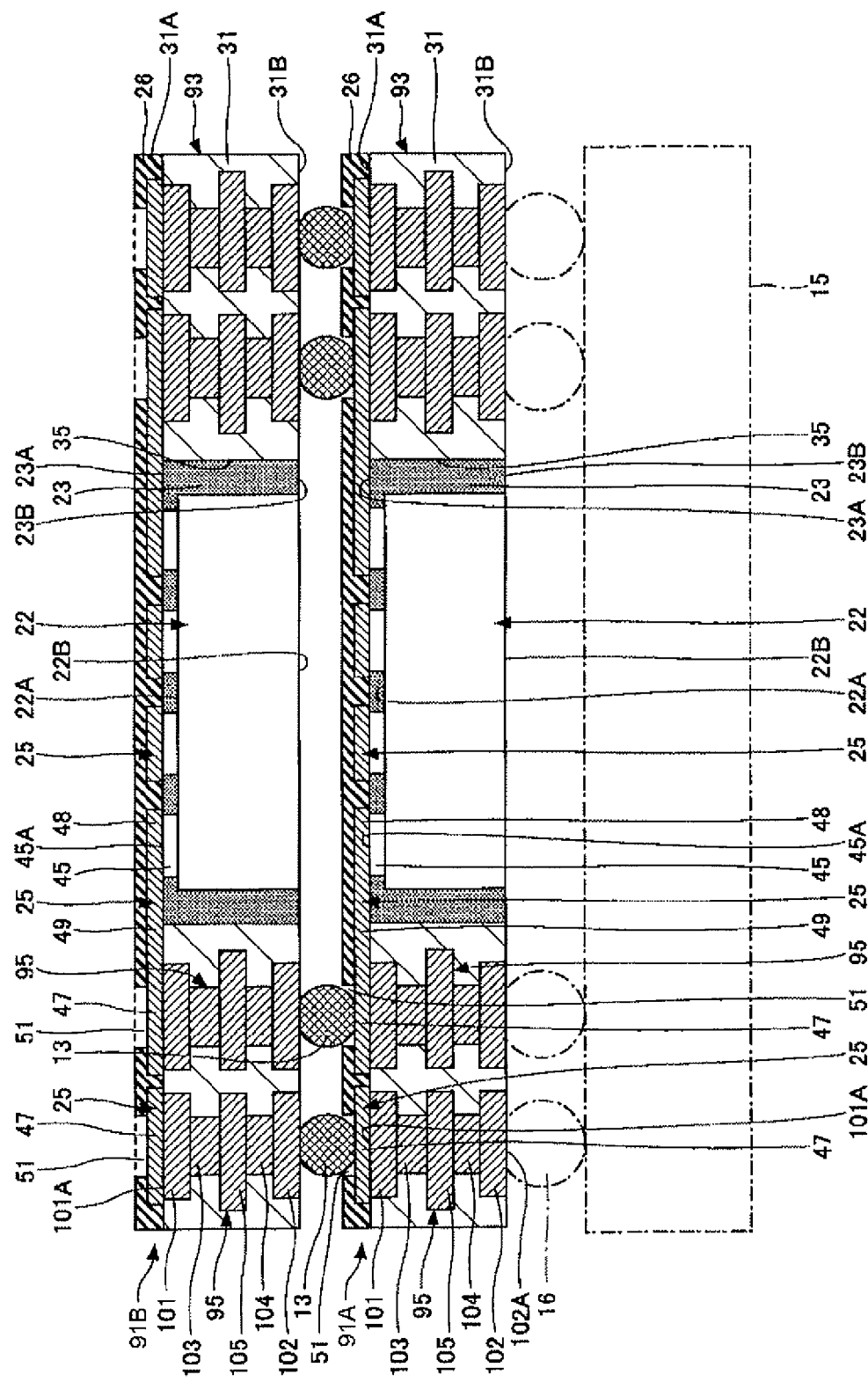
FIG. 18 is a sectional view showing an electronic device according to a second exemplary embodiment of the present invention.

FIG. 18 is a sectional view showing an electronic device according to a second exemplary embodiment of the present invention. Components identical with those of the electronic device 10 of the first exemplary embodiment are denoted by the same reference numerals in FIG. 18.

Referring to FIG. 18, an electronic device 90 of the second exemplary embodiment has a semiconductor device 91A, a semiconductor device 91B, and internal connection terminals 13. The semiconductor device 91B has a similar configuration to that of the semiconductor device 91A. Therefore, in the description to follow, the configuration of the semiconductor device 91A will be mainly discussed.

The semiconductor device 91A has a similar configuration to that of the semiconductor device 11A except that a wiring board 93 is provided in place of the wiring board 21 provided in the semiconductor device 11A of the first exemplary embodiment and except that seal resin 23 is provided only in a through part 35 and an electrode pad forming face 22A.

The wiring board 93 has a similar configuration to that of the wiring board 21 except that a conductor pattern 95 is provided in place of the through electrode 33 provided in the wiring board 21 described in the first exemplary embodiment and except that a thickness of a stacked body 31 is set substantially equal to a thickness of an electronic component 22.

The conductor pattern 95 is internally provided in the stacked body 31 and has pads 101 and 102, vias 103 and 104, and wiring 105.

The pad 101 has a first connection face 101A. The pad 101 is internally provided in the stacked body 31 in a state in which the first connection face 101A is exposed from a face 31A of multilayer wiring structure 31. The first connection face 101A is made planar with a face 23A of the seal resin 23, the face 31A of the multilayer wiring structure 31, and connection faces 45A. The first connection face 101A is connected to a pad part 47 provided in a wiring pattern 25. Accordingly, the conductor pattern 95 is electrically connected to the electronic component 22 through the wiring pattern 25.

The pad 102 has a second connection face 102A. The pad 102 is internally provided in the stacked body 31 in a state in which the second connection face 102A is exposed from a face 31B of the multilayer wiring structure 31. The second connection face 102A is made planar with a rear face 22B of the electronic component 22, a face 23B of the seal resin 23, and the face 31B of the multilayer wiring structure 31. The second connection face 102A is a face connected to an external connection terminal 16 (for example, a solder ball) electrically connected to a mounting board 15 when the electronic device 90 is mounted on the mounting board 15.

The via 103 is disposed so as to penetrate the stacked body 31 in the portion positioned between the pad 101 and the wiring 105. The via 103 has one end connected to the pad 101 and the other end connected to the wiring 105.

The via 104 is disposed so as to penetrate the stacked body 31 in the portion positioned between the pad 102 and the wiring 105. The via 104 has one end connected to the wiring 105 and the other end connected to the pad 102.

The wiring 105 is internally provided in the stacked body 31 and is connected to the vias 103 and 104. Accordingly, the pads 101 and 102 are electrically connected through the vias 103 and 104 and the wiring 105.

The wiring board 93 can be provided, for example, by laminating an insulating layer and a conductor layer by a build-up method on a metal plate to form the stacked body 31 having a conductor pattern 95 and next forming the through part 35 in the stacked body 31 by punching.

The described semiconductor device 91A of the second exemplary embodiment can provide similar advantages to those of the semiconductor device 11A, 11B of the first exemplary embodiment. The described semiconductor device 91A can be manufactured according to a similar technique to the manufacturing method of the semiconductor device 11A of the first exemplary embodiment described above.

The semiconductor device 91B has a similar configuration to that of the semiconductor device 91A and thus can provide similar advantages to those of the semiconductor device 91A. The semiconductor device 91B is placed above the semiconductor device 91A so that the pad part 47 provided in the semiconductor device 91A and the pad part 102 provided in the semiconductor device 91B oppose each other. The face of the semiconductor device 91B on the side opposed to the semiconductor device 91A is made a flat face.

The internal connection terminals 13 are placed between the semiconductor device 91A and the semiconductor device 91B. The internal connection terminals 13 are connected to the pad part 47 provided in the semiconductor device 91A and the pad part 102 provided in the semiconductor device 9113. Accordingly, the semiconductor devices 91A and 91B are electrically connected through the internal connection terminals 13.

The described electronic device 90 of the second exemplary embodiment can provide similar advantages to those of the electronic device 10 of the first exemplary embodiment.

Figure 19:
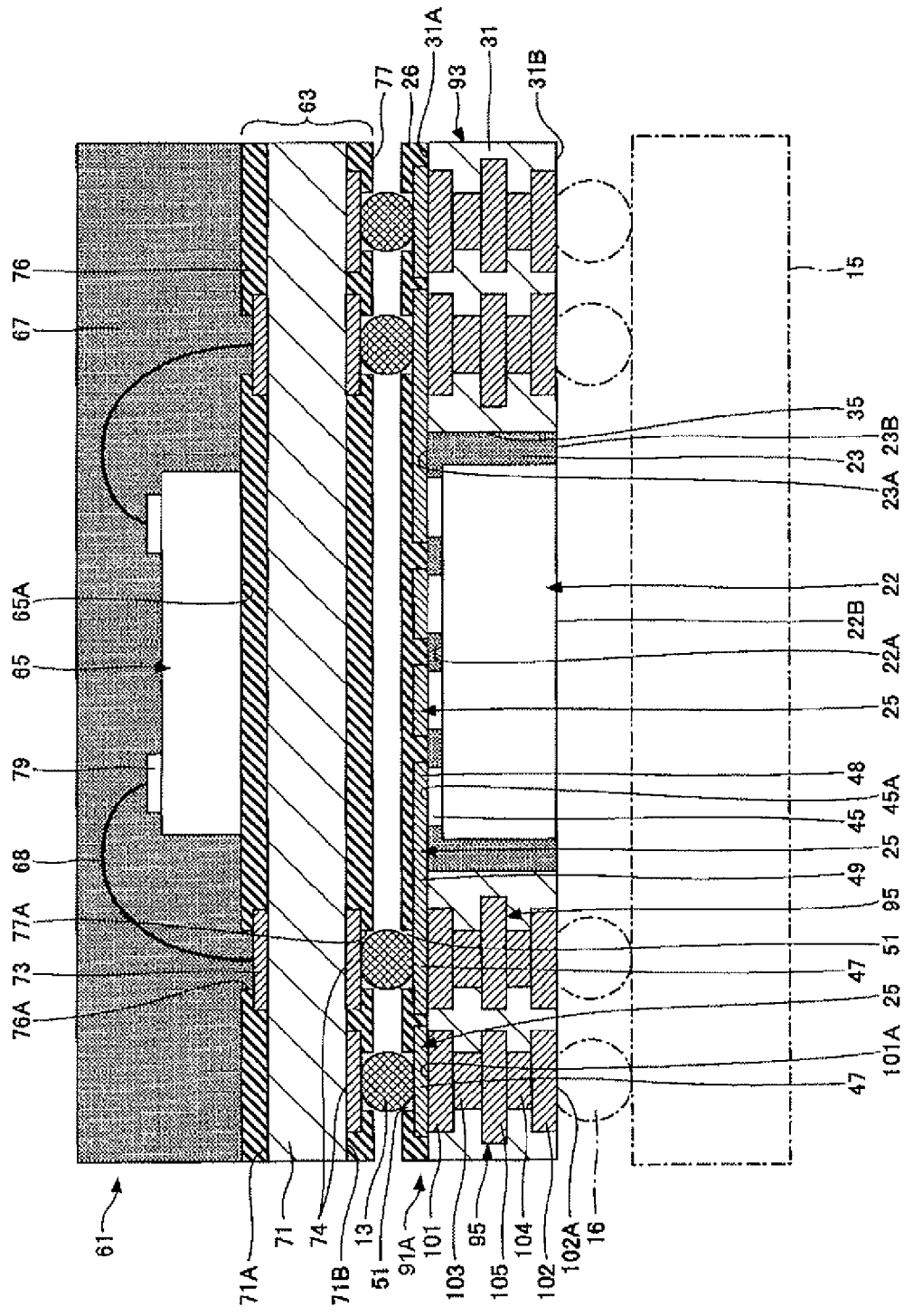
FIG. 19 is a sectional view showing an electronic device according to a first modified example of the second exemplary embodiment.

FIG. 19 is a sectional view showing an electronic device according to a first modified example of the second exemplary embodiment. Components identical with those of the semiconductor device 91A of the second exemplary embodiment and the semiconductor device 61 shown in FIG. 3 are denoted by the same reference numerals in FIG. 19.

Referring to FIG. 19, an electronic device 110 according to the first modified example of the second exemplary embodiment has a configuration wherein the semiconductor device 61 shown in FIG. 3 is placed above the semiconductor device 91A of the second exemplary embodiment and the pad 47 provided in the semiconductor device 91A and the pad 74 provided in the semiconductor device 61 are electrically connected by the internal connection terminals 13.

Thus, the semiconductor devices 91A and 61 different in configuration may be stacked and may be electrically connected through the internal connection terminals 13. The described electronic device 110 according to the first modified example of the second exemplary embodiment can provide similar advantages to those of the electronic device 90 of the second exemplary embodiment except that an additional semiconductor device cannot be stacked on the semiconductor device 61.

Figure 20:
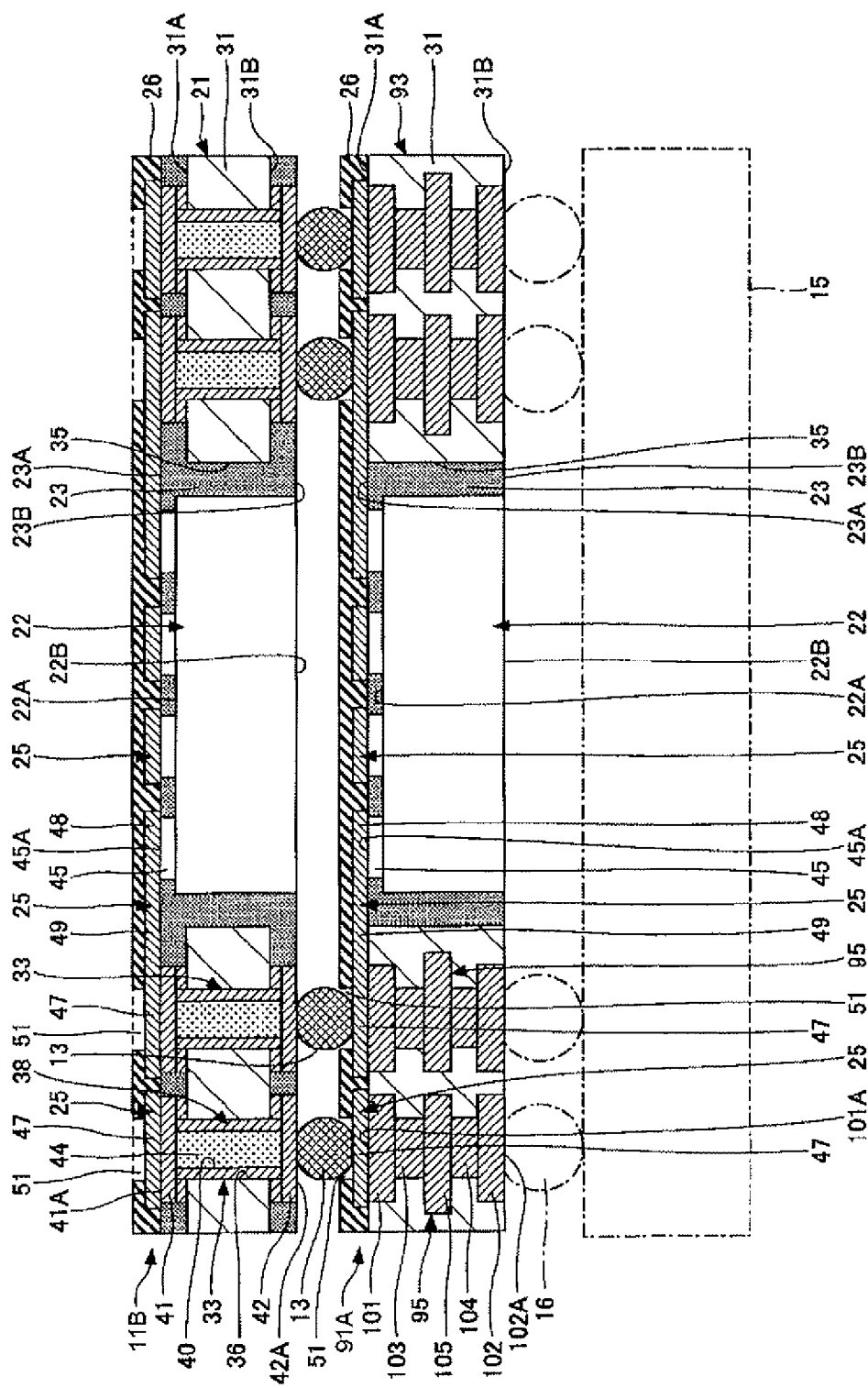
FIG. 20 is a sectional view showing an electronic device according to a second modified example showing the second exemplary embodiment.

FIG. 20 is a sectional view showing an electronic device according to a second modified example of the second exemplary embodiment of the invention. Components identical with those of the semiconductor device 11B of the first exemplary embodiment and the semiconductor device 91A of the second exemplary embodiment are denoted by the same reference numerals in FIG. 20.

Referring to FIG. 20, an electronic device 115 according to the second modified example of the second exemplary embodiment has a configuration wherein the semiconductor device 11B of the first exemplary embodiment is placed above the semiconductor device 91A of the second exemplary embodiment and the pad 47 provided in the semiconductor device 91A and the second connection face 42A provided in the semiconductor device 11B are electrically connected by the internal connection terminals 13.

Thus, the semiconductor devices 11B and 91A different in configuration may be stacked and may be electrically connected through the internal connection terminals 13. The described electronic device 115 according to the second modified example of the second exemplary embodiment can provide similar advantages to those of the electronic device 90 of the second exemplary embodiment.

Third Exemplary Embodiment

Figure 21:
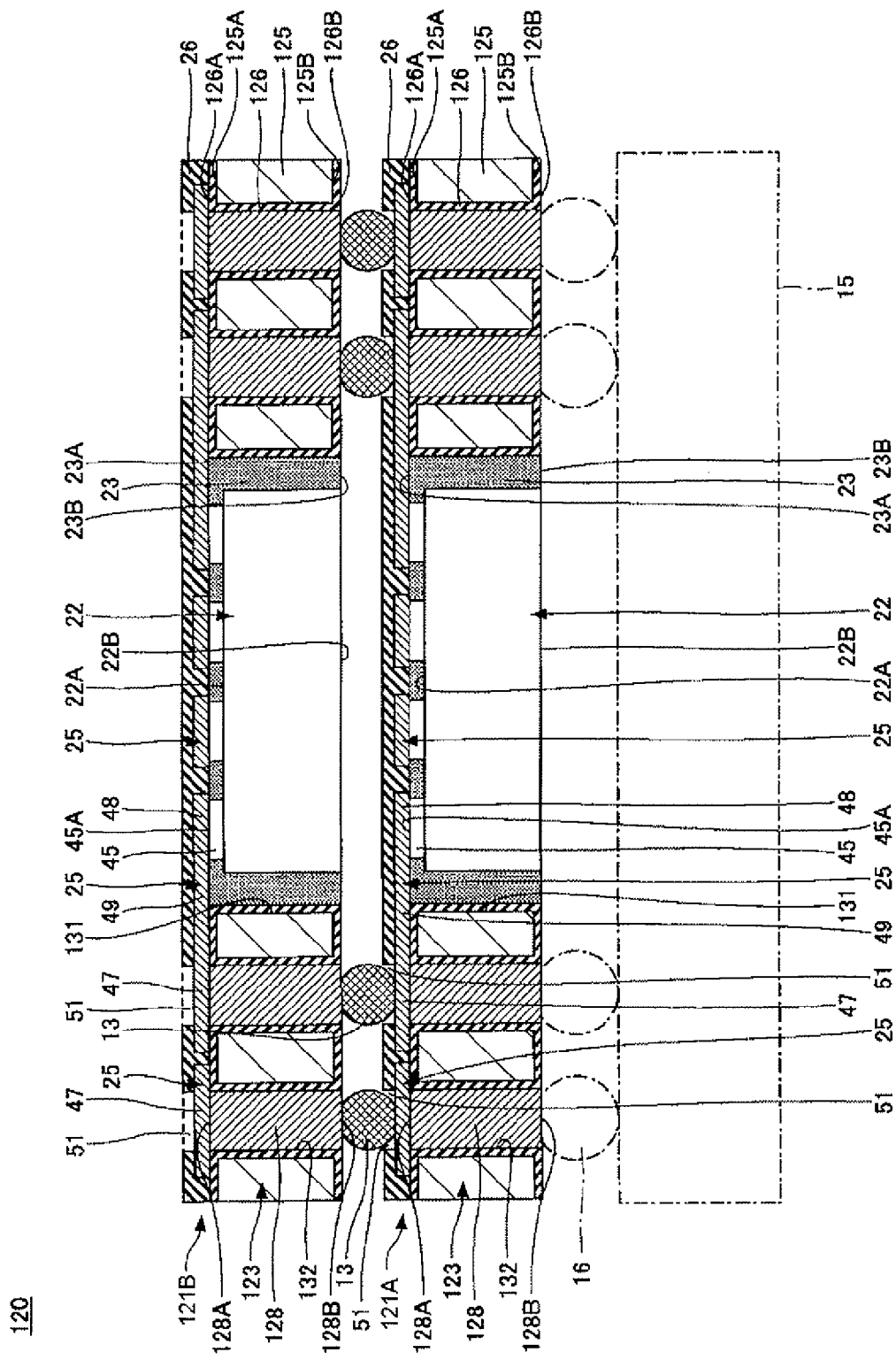
FIG. 21 is a sectional view showing an electronic device according to a third exemplary embodiment of the present invention.

FIG. 21 is a sectional view showing an electronic device according to a third exemplary embodiment of the present invention. Components identical with those of the electronic device 90 of the second exemplary embodiment are denoted by the same reference numerals in FIG. 21.

Referring to FIG. 21, an electronic device 120 of the third exemplary embodiment has a semiconductor device 121A, a semiconductor device 121B, and internal connection terminals 13. The semiconductor device 121B has a similar configuration to that of the semiconductor device 121A. Therefore, in the description to follow, the configuration of the semiconductor device 121A will be mainly discussed.

The semiconductor device 121A has a similar configuration to that of the semiconductor device 91A except that a wiring board 123 is provided in place of the wiring board 93 provided in the semiconductor device 91A of the second exemplary embodiment.

The wiring board 123 has a silicon board 125, an insulating film 126, and through electrodes 128. The silicon board 125 has a through part 131 housing an electronic component 22, and multiple through holes 132 formed surrounding the through part 131. A thickness of the silicon board 125 is set to substantially equal to the thickness of the electronic component 22. If the thickness of the electronic component is 300 µm, the thickness of the silicon board 125 can be set to 300 µm, for example. In this case, a diameter of the through hole 132 can be set to 150 µm, for example.

Thus, the silicon board 125 is formed with the through part 131 housing the electronic component 22 and the thickness of the silicon board 125 is set to substantially equal to the thickness of the electronic component 22, whereby projecting of the electronic component 22 from both faces 125A and 125B of the silicon board 125 is eliminated, so that the semiconductor device 121A can be downsized in the thickness direction.

Silicon is used as a material of the electronic component 22, whereby a difference of a thermal expansion coefficient between the silicon board 125 and the electronic component 22 is reduced, so that warpage occurring in the semiconductor device 121A can be decreased.

The insulating film 126 is provided so as to cover both faces 125A and 125B of the silicon board 125 and the face of the silicon board 125 in the portion forming the through part 131 and the through holes 132. An upper face 126A of the insulating film 126 in the portion provided in a face 125A (first face) of the silicon board 125 is formed so as to be substantially on the same plane as a connection face 45A of an electrode pad 45 and a face 23A of seal resin 23. A lower face 126B of the insulating film 126 in the portion provided in a face 125B (second face) of the silicon board 125 is formed so as to be substantially on the same plane as a rear face 22B of the electronic component 22 and a face 23B of the seal resin 23.

For example, an oxide film ($SiO_2$ film) can be used as the insulating film 126. A thickness of the insulating film 126 can be set to 1 to 2 µm, for example. To use an oxide film ($SiO_2$ film) as the insulating film 126, the insulating film 126 can be formed by a CVD method or a thermal oxidation method, for example.

The through electrode 128 is provided in the through hole 132 where the insulating film 126 is formed. A depth of the through electrode 128 is formed so as to be substantially equal to the thickness of the electronic component 22. An upper end face 128A (first connection face) of the through electrode 128 is formed so as to be substantially on the same plane as the face 23A of the seal resin 23, the connection face 45A, and the upper face 126A of the insulating film 126. An upper end of the through electrode 128 is connected directly to the pad part 47 forming a wiring pattern 25. Accordingly, the through electrode 128 is electrically connected to the electronic component 22 through the wiring pattern 25.

Thus, the wiring pattern 25 and the electrode pads 45 are directly connected without the intervention of a bump, so that the electric connection reliability between the through electrode 128 and the electronic component 22 can be improved.

A lower end face 128B (second connection face) of the through electrode 128 is formed so as to be substantially on the same plane as the face 23B of the seal resin 23, the rear face 22B of the electronic component 22, and the lower face 126B of the insulating film 126. When the electronic device 120 is mounted on a mounting board 15, the lower end face 128B of the through electrode 128 is a portion to which an external connection terminal 16 connected to the mounting board 15 is connected.

For example, Cu can be used as a material of the through electrode 128 described above.

The wiring board 123 can be provided by forming the through holes 132 and the through part 131 in the silicon board 125 by etching, for example, and then forming the insulating film 126 on the surface of the silicon board 125 containing the inner walls of the through holes 132 and the inner walls of the through part 131 and next filling the through holes 132 using a plate film to form the through electrode 128.

The wiring pattern 25 is provided on the face 23A of the seal resin 23, the connection face 45A, the upper face 126A of the insulating film 126, and the upper end face 128A. The pad part 47 forming a part of the wiring pattern 25 is connected to the upper end face 128A of the through electrode 128. The pad part 48 forming a part of the wiring pattern 25 is connected directly to the connection face 45A of the electrode pad 45. Accordingly, the through electrode 128 and the electronic component 22 are electrically connected through the wiring pattern 25.

According to the semiconductor device of the third exemplary embodiment, the silicon board 125 having the through part 131 housing the electronic component 22 and the through holes 132 and having the thickness substantially equal to that of the electronic component 22, the through electrode 128 having the upper end face 128A substantially on the same plane as the face 23A of the seal resin 23, the connection face 45A, and the upper face 126A of the insulating film 126 and the lower end face 128B substantially on the same plane as the face 23B of the seal resin 23, the rear face 22B of the electronic component 22, and the lower face 126B of the insulating film 126, the seal resin 23 provided in the through part 131 housing the electronic component 22 and an electrode pad forming face 22A, and the wiring pattern 25 electrically connecting the through electrode 128 and the electronic component 22 are provided, whereby projecting of the electronic component 22 from both faces 125A and 125B of the silicon board 125 and both end faces 128A and 128B of the through electrode 128 is eliminated, so that the semiconductor device 121A can be downsized in the thickness direction.

The wiring pattern 25 and the electrode pads 45 are directly connected without the intervention of a bump, so that the electric connection reliability between the through electrode 128 and the electronic component 22 can be improved.

Further, silicon is used as a material of the electronic component 22, whereby the difference of the thermal expansion coefficient between the silicon board 125 and the electronic component 22 lessens, so that the warpage occurring in the semiconductor device 121A can be decreased.

The semiconductor device 121B has a similar configuration to that of the semiconductor device 121A and thus can provide similar advantages to those of the semiconductor device 121A previously described. The semiconductor device 121B is placed above the semiconductor device 121A so that the pad part 47 provided in the semiconductor device 121A and the lower end face 128B of the through electrode 128 provided in the semiconductor device 121B oppose each other. The face of the semiconductor device 121B on the side opposed to the semiconductor device 121A is made a flat face.

The internal connection terminals 13 are placed between the semiconductor device 121A and the semiconductor device 121B. The semiconductor device 121A in the portion opposed to the semiconductor device 121B is formed with the wiring pattern 25 and a solder resist layer 26 on a flat face and thus has a small step (for example, 50 µm).

The face of the semiconductor device 121B on the side opposed to the semiconductor device 121A is made a flat face. The internal connection terminals 13 are connected to the pad part 47 provided in the semiconductor device 121A and the lower end face 128B of the through electrode 128 provided in the semiconductor device 121B. Accordingly, the semiconductor devices 121A and 121B are electrically connected through the internal connection terminals 13.

Each of the internal connection terminals 13 electrically connecting the semiconductor device 121A with the semiconductor device 121B is provided between the semiconductor device 121A in the small step portion and the flat face of the semiconductor device 121B, whereby it is possible to reduce the diameter of each of the internal connection terminals 13, so that the electronic device 120 can be downsized in the thickness direction.

The diameter of the internal connection terminal 13 is reduced, whereby it is possible to place the through electrodes 33 at a narrow pitch and thus the number of electric connection parts between the semiconductor device 121A and the semiconductor device 121B can be increased. In other words, the number of internal connection terminals 13 placed between the semiconductor devices 121A and 121B can be increased.

The semiconductor devices 121A and 121B downsized in the thickness direction are stacked, whereby the electronic device 120 can be downsized in the thickness direction.

Fourth Exemplary Embodiment

Figure 22:
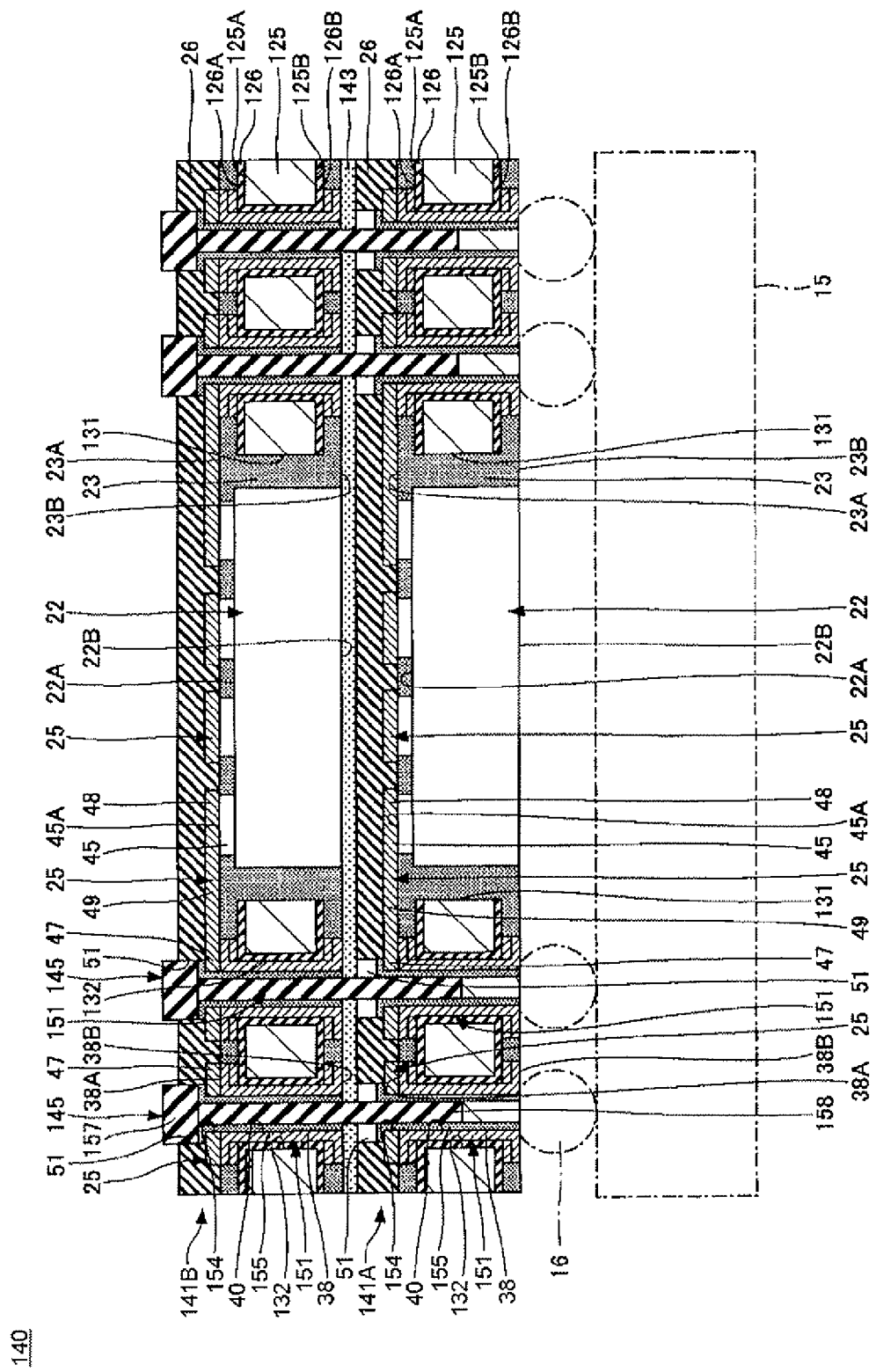
FIG. 22 is a sectional view showing an electronic device according to a fourth exemplary embodiment of the present invention.

FIG. 22 is a sectional view showing an electronic device according to a fourth exemplary embodiment of the present, invention. Components identical with those of the electronic devices 10 and 120 of the first and third exemplary embodiments are denoted by the same reference numerals in FIG. 22.

Referring to FIG. 22, an electronic device 140 of the fourth exemplary embodiment has a semiconductor device 141A, a semiconductor device 141B, an adhesive 143, and pin terminals 145.

The semiconductor device 141B has a similar configuration to that of the semiconductor device 141A. Therefore, in the description to follow, the configuration of the semiconductor device 141A will be mainly discussed.

The semiconductor device 141A has a similar configuration to that of the semiconductor device 121A except that a through electrode 151 is provided in place of the through electrode 128 provided in the semiconductor device 121A of the third exemplary embodiment, a through hole 154 is provided in a pad part 47, a thickness of a silicon board 125 is thinner than a thickness of an electronic component 22, seal resin 23 is provided in a through part 131, an electrode pad forming face 22A, and an upper face 126A of an insulating film 126, further solder 155 is provided.

The through electrode 151 is provided in a through hole 132 where the insulating film 126 is formed. The through electrode 151 has a similar configuration to that of the through electrode 33 previously described with reference to FIG. 2 in the first exemplary embodiment except that pad parts 41 and 42 are excluded from the components of the through electrode 33. The through electrode 151 has a via part 38 projected from the upper face 126A and a lower face 126B of the insulating film 126 and a through hole 40 penetrating the center of the via part 38. The through hole 40 is a hole to insert the pin terminal 145. A diameter of the through hole 40 can be set to 250 µm, for example.

The via part 38 has a first connection face 38A and a second connection face 38B. The first connection face 38A is provided in the via part 38 in the portion projected from the upper face 126A of the insulating film 126. The first connection face 38A is formed so as to be substantially on the same plane as a face 23A of the seal resin 23 and the connection face 45A. The first connection face 38A is connected to the pad part 47 forming a part of a wiring pattern 25 provided in the face 23A of the seal resin 23, the first connection face 38A, and the connection face 45A. Accordingly, the through electrode 151 is electrically connected to the electronic component 22 through the wiring pattern 25.

The second connection face 38B is provided in the via part 38 in the portion projected from the lower face 126B of the insulating film 126. The second connection face 38B is formed so as to be substantially on the same plane as a face 23B of the seal resin 23 and a rear face 22B of the electronic component 22. The second connection face 38B is a face connected to an external connection terminal 16 connected to a mounting board 15 when the electronic device 140 is mounted on the mounting board 15.

The through hole 154 is formed so as to penetrate the pad part 47 in the portion opposed to the through hole 40. The through hole 154 is formed integrally with the through hole 40. The through hole 154 is a hole to insert the pin terminal 145. A diameter of the through hole 154 is substantially equal to the diameter of the through hole 40. The diameter of the through hole 154 can be set to 250 μm, for example. The through holes 40 and 154 form pin terminal insertion hole.

The solder 155 is provided in the via part 38 in the portion corresponding to a side face of the through hole 40 and the via part 38 in the portion exposed to the opening 51. The solder 155 is provided for fixing the pin terminals 145 inserted into the through holes 40 and 154.

According to the semiconductor device of the fourth exemplary embodiment, projecting of the electronic component 22 housed in the through part 131 formed in the silicon board 125 from the first and second connection faces 38A and 38B of the through electrode 151 is eliminated, so that the electronic device 140 can be downsized in the thickness direction.

The wiring pattern 25 and the electrode pads 45 are directly connected without the intervention of a bump, so that the electric connection reliability between the through electrode 151 and the electronic component 22 can be improved.

Further, silicon is used as a material of the electronic component 22, whereby the difference of the thermal expansion coefficient between the silicon board 125 and the electronic component 22 lessens, so that warpage occurring in the semiconductor device 141A can be decreased.

The semiconductor device 141B has a similar configuration to that of the semiconductor device 141A and thus can provide similar advantages to those of the semiconductor device 141A previously described. The semiconductor device 141B is placed above the semiconductor device 141A so that the through hole 154 provided in the semiconductor device 141A and the through hole 40 provided in the semiconductor device 141B oppose each other. The semiconductor device 141B is adhered to the semiconductor device 141A through an adhesive 143 (for example, a vinyl chloride based adhesive).

The pin terminal 145 has a head part 157 and a pin part 158. The head part 157 has a larger diameter than the pin part 158 and is housed in the opening 51 provided with the solder 155. The head part 157 is fixed to the semiconductor device 141B with the solder 155.

The pin part 158 is formed integrally with the head part 157. The pin part 158 is inserted into the through hole 40, 154 (pin terminal insertion hole) formed in the semiconductor devices 141A and 141B. The pin part 158 is fixed to the through electrode 151 formed in the semiconductor devices 141A and 141B with the solder 155 formed in the through hole 40, 154. Accordingly, the pin terminal 145 electrically connects the semiconductor device 141A with the semiconductor device 141B.

According to the electronic device of the fourth exemplary embodiment, the semiconductor device 141A and the semiconductor device 141B are adhered with the adhesive 143 and it is possible to electrically connect the semiconductor device 141A with the semiconductor device 141B without providing internal connection terminals 13 between the semiconductor device 141A and the semiconductor device 141B, so that the electronic device 140 can be downsized in the thickness direction.

Although the preferred exemplary embodiments of the invention have been described, it is to be understood that the invention is not limited to the specific exemplary embodiments thereof and various modifications and changes may be made without departing from the spirit and the scope as set out in the claims.

What is claimed is:

1. A semiconductor device comprising:
a wiring board which includes a first face and a second face opposite to the first face and in which a through part and a through hole penetrating the wiring board from the first face to the second face are provided, the through hole being disposed in a peripheral of the through part;
a through electrode which includes
a connection portion which is provided in the through hole,
a first pad which is connected to one end of the connection portion, and which extends along the first face of the wiring board, the first pad having a first connection face at a distal side opposite to a proximal side connected to the connection portion, and
a second pad which is connected to the other end of the connection portion, and which extends along the second face of the wiring board, the second pad having a second connection face at a distal side opposite to a proximal side connected to the connection portion;
an electronic component which is housed in the through part and which includes an electrode pad forming face on which an electrode pad is formed and a rear face opposite to the electrode pad forming face, the electrode pad forming face extending beyond the first face of the wiring board;
a seal resin which is provided in the through part, on the electrode pad forming face of the electronic component, and on the first and second faces of the wiring board so as to cover side faces of the electrode pad and the first and second pads, and which includes a first plane exposing a connection face of the electrode pad and the first connection face of the first pad and a second plane exposing the rear face of the electronic component and the second connection face of the second pad; and
a wiring pattern which is provided on the connection face of the electrode pad, the first connection face of the first pad and the first plane of the seal resin to electrically connect the connection face of the electrode pad with the first connection face of the first pad,
wherein the first plane of the seal resin, the connection face of the electrode pad and the first connection face of the first pad are flat and a bottom surface of the wiring pattern is coplanar with the first plane of the seal resin, the connection face of the electrode pad and the first connection face of the first pad throughout an entire horizontal length of the wiring pattern from the connection face of the electrode pad to the first connection face of the first pad, and
wherein the second plane of the seal resin, the rear face of the electronic component and the second connection face of the second pad are flat.

2. The semiconductor device according to claim 1, wherein the seal resin is filled in the through part so as to cover a side wall face of the through part.

3. The semiconductor device according to claim 1, wherein a solder resist layer having an opening exposing the first pad is provided on the wiring pattern and on the first plane of the seal resin.

4. The semiconductor device according to claim 1,
wherein a total thickness of the electronic component and the electrode pad is the same as a total thickness of the first pad, the connecting portion and the second pad of the through electrode.

5. The semiconductor device according to claim 1,
wherein a total thickness of the electronic component and the electrode pad is the same as a thickness of the wiring board.

6. A semiconductor device comprising:
a silicon substrate which includes a first face and a second face opposite to the first face and in which a through part and a through hole penetrating the silicon substrate from the first face to the second face are provided, the through hole being disposed in a peripheral of the through part;
an insulating film which includes
  a side wall portion provided on a side wall face of the through hole,
  a upper portion covering the first face of the silicon substrate, the upper portion having an upper face, and
  a lower portion covering the second face of the silicon substrate, the lower portion having a lower face;
a through electrode which is provided in the through hole via the insulating film and which includes an upper face exposed from the upper face of the insulating film so as to be flat with the upper face of the insulating film and a lower face exposed from the lower face of the insulating film so as to be flat with the lower face of the insulating film;
an electronic component which is housed in the through part and which includes an electrode pad forming face on which an electrode pad is formed and a rear face opposite to the electrode pad forming face, the electrode pad forming face;
a seal resin which is provided in the through part and on the electrode pad forming face of the electronic component so as to cover side faces of the electrode pad, and which includes a first plane exposing a connection face of the electrode pad and a second plane exposing the rear face of the electronic component, the first plane being flat with the connection face of the electrode pad, the upper face of the insulating film and the upper face of the through electrode, the second plane being flat with the rear face of the electronic component, the lower face of the insulating film and the lower face of the through electrode; and
a wiring pattern which is provided on the connection face of the electrode pad, the upper face of the insulating film, the upper face of the through electrode and the first plane of the seal resin to electrically connect the connection face of the electrode pad with the upper face of the through electrode,
wherein the first plane of the seal resin, the connection face of the electrode pad, the upper face of the insulating film and the upper face of the through electrode are planar and a bottom surface of the wiring pattern is coplanar with the first plane of the seal resin, the connection face of the electrode pad, the upper face of the insulating film and the upper face of the through electrode throughout an entire horizontal length of the wiring pattern from the connection face of the electrode pad to the upper face of the through electrode, and
wherein the second plane of the seal resin, the rear face of the electronic component, the lower face of the insulating film and the lower face of the through electrode are planar.

7. The semiconductor device according to claim 6,
wherein a total thickness of the electronic component and the electrode pad is the same as a thickness of the semiconductor substrate.

8. A semiconductor device comprising:
a silicon substrate which includes a first face and a second face opposite to the first face and in which a through part and a through hole penetrating the silicon substrate from the first face to the second face are provided, the through hole being disposed in a peripheral of the through part;
an insulating film provided on a side wall face of the through hole and on the first face and the second face of the silicon substrate;
a through electrode which includes
  a connection portion which is provided in the through hole via the insulating film,
  a first pad which is connected to one end of the connection portion, and which extends along the first face of the silicon substrate, the first pad having an upper face at a distal side opposite to a proximal side connected to the connection portion, and
  a second pad which is connected to the other end of the connection portion, and which extends along the second face of the silicon substrate, the second pad having a lower face at a distal side opposite to a proximal side connected to the connection portion;
an electronic component which is housed in the through part and which includes an electrode pad forming face on which an electrode pad is formed and a rear face opposite to the electrode pad forming face, the electrode pad forming face extending beyond the first face of the silicon substrate;
a seal resin which is provided in the through part and on the electrode pad forming face of the electronic component and on the first face and the second face of the silicon substrate so as to cover side faces of the electrode pad and which includes a first plane exposing a connection face of the electrode pad and the upper face of the first pad and a second plane exposing the rear face of the electronic component and the lower face of the second pad; and
a wiring pattern which is provided on the connection face of the electrode pad, the upper face of the first pad and the first plane of the seal resin to electrically connect the connection face of the electrode pad with the upper face of the first pad,
wherein a pin terminal insertion hole which penetrates through a center portion of the through electrode and a portion of the wiring pattern corresponding to the center portion of the through electrode and into which a pin terminal is inserted is provided therein,
wherein the first plane of the seal resin, the connection face of the electrode pad and the upper face of the first pad are planar and a bottom surface of the wiring pattern is coplanar with the first plane of the seal resin, the connection face of the electrode pad and the upper face of the first pad throughout an entire horizontal length of the wiring pattern from the connection face of the electrode pad to the upper face of the first pad, and
wherein the second plane of the seal resin, the rear face of the electronic component and the lower face of the second pad are planar.

9. An electronic device comprising:
a semiconductor device according to claim 1 as a first semiconductor device;
a second semiconductor device disposed on the first semiconductor device; and an internal connection terminal disposed between the first semiconductor device and the second semiconductor device for electrically connecting the first semiconductor device with the second semiconductor device.

10. An electronic device comprising:
a plurality of semiconductor devices according to claim 6 which are laminated and which are electrically connected via an internal connection terminal.

11. An electronic device comprising:
two semiconductor devices according to claim 8 which are laminated and which are electrically connected via the pin terminal.

12. A semiconductor device comprising:
a wiring board which includes a first face and a second face opposite to the first face and in which a through part penetrating the wiring board from the first face to the second face is provided;
a conductor pattern which penetrates the wiring board from the first face to the second face at a peripheral of the through part, the conductor pattern including
  a first pad being disposed inside the wiring board having a first connection face being flat with the first face of the wiring board,
  a first via being disposed inside the wiring board adjacent to the first pad in a depth direction of the wiring board,
  a wiring being disposed inside the wiring board adjacent to the first via in the depth direction of the wiring board,
  a second via being disposed inside the wiring board adjacent to the wiring in the depth direction of the wiring board, and
  a second pad being disposed inside the wiring board adjacent to the second via in the depth direction of the wiring board and having a second connection face being flat with the second face of the wiring board,
an electronic component which is housed in the through part, and which includes an electrode pad forming face on which an electrode pad is formed and a rear face opposite to the electrode pad forming face;
a seal resin which is provided in the through part and on the electrode pad forming face of the electronic component so as to cover side faces of the electrode pad and seal the electronic component, and which includes a first plane exposing a connection face of the electrode pad and a second plane exposing the rear face of the electronic component, the first plane being flat with the connection face of the electrode pad, the first face of the wiring board and the first connection face of the first pad, the second plane being flat with the rear face of the electronic component, the second face of the wiring board and the second connection face of the second pad; and
a wiring pattern which is provided on the connection face of the electrode pad, the first connection face of the first pad and the first plane of the seal resin to electrically connect the connection face of the electrode pad with the first connection face of the first pad, a bottom surface of the wiring pattern being coplanar with the first plane of the seal resin, the connection face of the electrode pad and the first connection face of the first pad throughout an entire horizontal length of the wiring pattern from the connection face of the electrode pad to the first connection face of the first pad.

* * * * *